US009881900B2

(12) United States Patent
Takeda et al.

(10) Patent No.: US 9,881,900 B2
(45) Date of Patent: Jan. 30, 2018

(54) SEMICONDUCTOR DEVICE

(71) Applicant: ROHM CO., LTD., Kyoto (JP)

(72) Inventors: Hirofumi Takeda, Kyoto (JP);
Yoshihisa Takada, Kyoto (JP)

(73) Assignee: ROHM CO., LTD, Kyoto (JP)

( * ) Notice: Subject to any disclaimer, the term of this patent is extended or adjusted under 35 U.S.C. 154(b) by 0 days.

(21) Appl. No.: 15/379,437

(22) Filed: Dec. 14, 2016

(65) Prior Publication Data

US 2017/0098625 A1 Apr. 6, 2017

Related U.S. Application Data

(63) Continuation of application No. 14/807,868, filed on Jul. 23, 2015, now Pat. No. 9,559,028.

(30) Foreign Application Priority Data

Jul. 28, 2014 (JP) .................................. 2014-152775
Jul. 28, 2014 (JP) .................................. 2014-152778
Jun. 18, 2015 (JP) .................................. 2015-123021

(51) Int. Cl.
*H01L 23/24* (2006.01)
*H01L 25/065* (2006.01)
(Continued)

(52) U.S. Cl.
CPC .......... *H01L 25/0652* (2013.01); *H01L 23/13* (2013.01); *H01L 23/147* (2013.01); *H01L 23/3121* (2013.01); *H01L 23/49811* (2013.01); *H01L 24/16* (2013.01); *H01L 25/0657* (2013.01); *H01L 25/50* (2013.01); *H01L 2224/16227* (2013.01); *H01L 2224/16237* (2013.01); *H01L 2224/16238* (2013.01); *H01L 2225/06517* (2013.01);
(Continued)

(58) Field of Classification Search
CPC ....... H01L 23/13; H01L 23/16; H01L 23/147; H01L 23/3121; H01L 25/0657; H01L 23/49811; H01L 25/0652
USPC ....................................................... 257/687
See application file for complete search history.

(56) References Cited

U.S. PATENT DOCUMENTS 6,600,231 B2 7/2003 Tominaga
7,744,244 B2 6/2010 Huang
(Continued)

FOREIGN PATENT DOCUMENTS

JP 2012-099673 A 5/2012

*Primary Examiner* — Luan C Thai
(74) *Attorney, Agent, or Firm* — Rabin & Berdo, P.C.

(57) ABSTRACT

A semiconductor device is provided. The semiconductor device can be manufactured with a reduced cost. The semiconductor device (1D) includes, a substrate (100D), which includes a main surface (101D) and a recess (108D) depressed from the main surface (101D), and includes a semiconductor material; a wiring layer (200D) in which at least a portion thereof is formed on the substrate (100D); one or more first elements (370D) accommodated in the recess (108D); a sealing resin (400D) covering at least a portion of the one or more first elements (370D) and filled in the recess (108D); and a plurality of columnar conductive portions (230D) penetrating through the sealing resin (400D) in the depth direction of the recess (108D), and respectively connected with the portion of the wiring layer (200D) that is formed at the recess (108D).

19 Claims, 40 Drawing Sheets

(51) Int. Cl.
    *H01L 25/00*     (2006.01)
    *H01L 23/13*     (2006.01)
    *H01L 23/14*     (2006.01)
    *H01L 23/31*     (2006.01)
    *H01L 23/498*     (2006.01)
    *H01L 23/00*     (2006.01)

(52) U.S. Cl.
    CPC ............ *H01L 2225/06524* (2013.01); *H01L 2225/06548* (2013.01); *H01L 2225/06568* (2013.01); *H01L 2225/06582* (2013.01); *H01L 2924/10158* (2013.01); *H01L 2924/15156* (2013.01); *H01L 2924/15157* (2013.01)

(56) References Cited

U.S. PATENT DOCUMENTS

| | | |
|---|---|---|
| 8,558,392 B2 | 10/2013 | Chua et al. |
| 8,587,009 B2 | 11/2013 | Tsang |
| 8,598,695 B2 | 12/2013 | Oganesian et al. |
| 9,129,943 B1 * | 9/2015 | Huemoeller .......... H01L 23/481 |
| 9,337,116 B2 * | 5/2016 | Pagaila ............... H01L 23/3128 |
| 2012/0250326 A1 * | 10/2012 | Sekine ................ H01L 25/0753 |
| | | 362/249.08 |

* cited by examiner

SEMICONDUCTOR DEVICE

CROSS-REFERENCE TO RELATED APPLICATIONS

The present application is a Continuation application U.S. application Ser. No. 14/807,868, filed on Jul. 23, 2015, and allowed on Sep. 15, 2016, which claimed the benefit of priority of Japanese application No. 2014-152775, filed on Jul. 28, 2014, Japanese application No. 2014-152778, filed on Jul. 28, 2014, and Japanese application No. 2015-123021, filed on Jun. 18, 2015. The disclosures of these prior US and foreign applications are incorporated herein by reference.

BACKGROUND

The present disclosure relates to a semiconductor device.

Various forms of semiconductor devices capable of implementing specific functions for the input/out of the external current have been proposed (see, for example, patent literature 1). Generally, to implement the function of semiconductor devices, a plurality of elements respectively forming a portion of an electric circuit are disposed therein. Wires made of metals are used in order to support these elements and allow for the interconnection therebetween. The number, shape, and size of the wires are determined depending on the function and shape or size of the plurality of elements. The plurality of elements that are carried by the wires are covered by a sealing resin. The sealing resin is configured to protect at least a portion of these elements or wires. Such semiconductor devices are installed in, for example, the circuit substrates of an electronic apparatus.

In most cases, the wires are manufactured by using, for example, the die punching process. The advantage of die punching process includes good efficacy and accuracy in forming the wire. However, in general cases, the number, size, and shapes of the wire vary quite often depending on the elements. Accordingly, when the required function of the semiconductor device changes, the size or shape of the wire should be altered. In this scenario, it is inevitable to modify and remake the die. In the case where the cost of the die is relatively high and the production volume is relatively low, the manufacturing cost for such semiconductor device will increase.

Further, since the above-mentioned wire is manufactured using metal plates, it generally has a substantial smooth shape. Although it is possible to make the wire into a three-dimensional structure, the shaping process is somewhat constrained. In recent years, the market demands for semiconductor devices with enhanced performance and increased functionalities. To meet this demand, the high-density integration of multiple elements or steric configuration other than the smooth configuration is eagerly pursued.

PRIOR TECHNICAL LITERATURE

Patent Literature

[Patent literature 1] Japanese patent laid-open publication No. 2012-99673.

BRIEF SUMMARY OF THE INVENTION

Problems to be Solved in the Present Invention

The present invention is designed in view of the above-mentioned situations, and one purpose thereof is to provide a semiconductor device that can be manufactured with a reduced cost. Also, another purpose of the present invention is to relief the constraint on the configuration of a plurality of elements, thereby realizing the miniaturization of the semiconductor device. Further, another purpose of the present invention relates to the accurate manufacture of the semiconductor device so that it exhibits the intended function accurately.

Technical Means for Solving the Problems

The semiconductor device provided by the present invention comprises: a substrate, which comprises a main surface, and a recess depressed from the main surface, and comprises a semiconductor material; a wiring layer, wherein at least a portion of the wiring layer formed on the substrate; one or more first elements, which are accommodated in the recess; a sealing resin, which covers at least a portion of the one or more first elements, and is filled in the recess; and a plurality of columnar conductive portions, which penetrate through the sealing resin in the depth direction of the recess, and are connected with the portion of the wiring layer that is formed in the recess, respectively.

In preferred embodiments of the present invention, the recess comprises an inclined inner lateral face that is inclined relative to the main surface, and a bottom surface; and the columnar conductive portions extend from the inclined inner lateral face along the normal direction of the main surface.

In preferred embodiments of the present invention, the wiring layer comprises a plurality of inclined inner lateral face pads formed at the inclined inner lateral face, and respectively connected with one end of the columnar conductive portions In preferred embodiments of the present invention, the wiring layer comprises a plurality of external terminals respectively connected with the other end of the columnar conductive portions.

In preferred embodiments of the present invention, the sealing resin covers at least a portion of the main surface.

In preferred embodiments of the present invention, the sealing resin includes one end surface facing the outer side of the main surface in the normal direction, in which said one end surface is co-planar with said the other end of the columnar conductive portions, and a plurality of pads for the external terminals that are configured to carry the external terminals are formed at said one end surface of the sealing resin.

In preferred embodiments of the present invention, the recess comprises two inclined inner lateral faces spaced across the bottom surface.

In preferred embodiments of the present invention, wherein the plurality of columnar conductive portions respectively extend from the two inclined inner lateral faces along the normal direction of the main surface.

In preferred embodiments of the present invention, all of the plurality of columnar conductive portions extend from one of the two inclined inner lateral faces along the normal direction of the main surface, and the plurality of external terminals comprise a plurality of first external terminals, which, when viewing from the normal direction of the main surface, are in a superimposed position over any of the columnar conductive portions, and a plurality of second external terminals, which are spaced across the bottom surface at positions separated from the plurality of first external terminals.

Preferred embodiments of the present invention further comprise a resin forming portion formed in the recess.

In preferred embodiments of the present invention, the resin forming portion is formed at the bottom surface.

Preferred embodiments of the present invention further comprise a second element that covers at least a portion of the one or more first elements, and the second element is carried by the resin forming portion.

In preferred embodiments of the present invention, the wiring layer comprises a plurality of resin forming portion pads, which are formed at the resin forming portion and configured to carry the second element.

Preferred embodiments of the present invention comprises a second element that covers at least a portion of the one or more first elements; the recess comprises a first recess for accommodating the one or more first elements, and a second recess for accommodating the second element in which the second recess is closer to the main surface than the first recess is; the bottom surface comprises a first bottom surface for constituting the first recess and a second bottom surface for constituting the second recess in which the second bottom surface is closer to the main surface than the first bottom surface is; and the inclined inner lateral faces comprise a first inclined inner lateral face for constituting the first recess and a second inclined inner lateral face for constituting the second recess and connected with the second bottom surface and the main surface.

In preferred embodiments of the present invention, the second element is supported by the second bottom surface, and when viewing from the normal direction of the main surface, it is in a superimposed position over at least a portion of the first recess.

In preferred embodiments of the present invention, the columnar conductive portions extend from the second inclined inner lateral face along the normal direction of the main surface.

In preferred embodiments of the present invention, the inclined inner lateral face pads are formed at the second inclined inner lateral face.

In preferred embodiments of the present invention, the substrate comprises monocrystalline semiconductor material.

In preferred embodiments of the present invention, the semiconductor material is silicon.

In preferred embodiments of the present invention, the main surface is the surface (100), the first recess comprises four first inclined inner lateral faces, and the second recess comprises four second inclined inner lateral faces.

Many of the attendant features and advantages of the present disclosure will becomes better understood with reference to the following detailed description considered in connection with the accompanying drawings.

DETAILED DESCRIPTION

Preferred embodiments of the present invention are described hereinbelow by referencing to the appended drawings.

Figure 1:
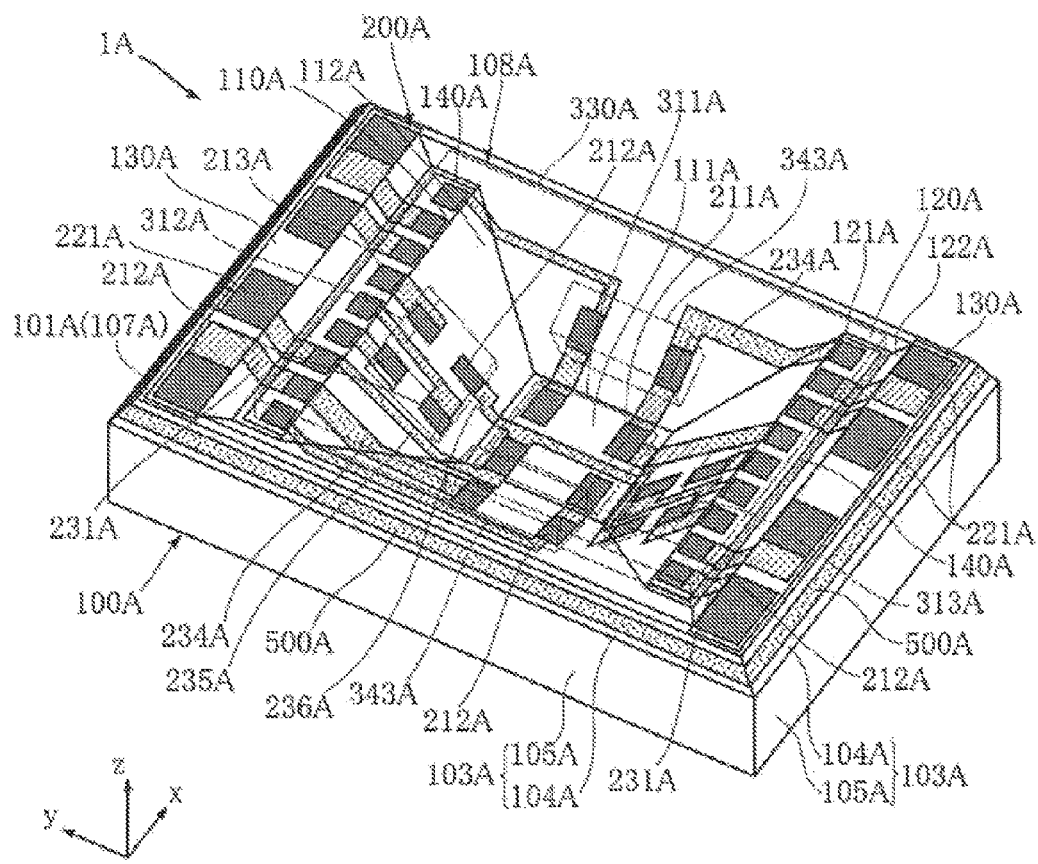
FIG. 1 is stereogram illustrating the main portion of a semiconductor device according to the first embodiment of the present invention.
Figure 2:
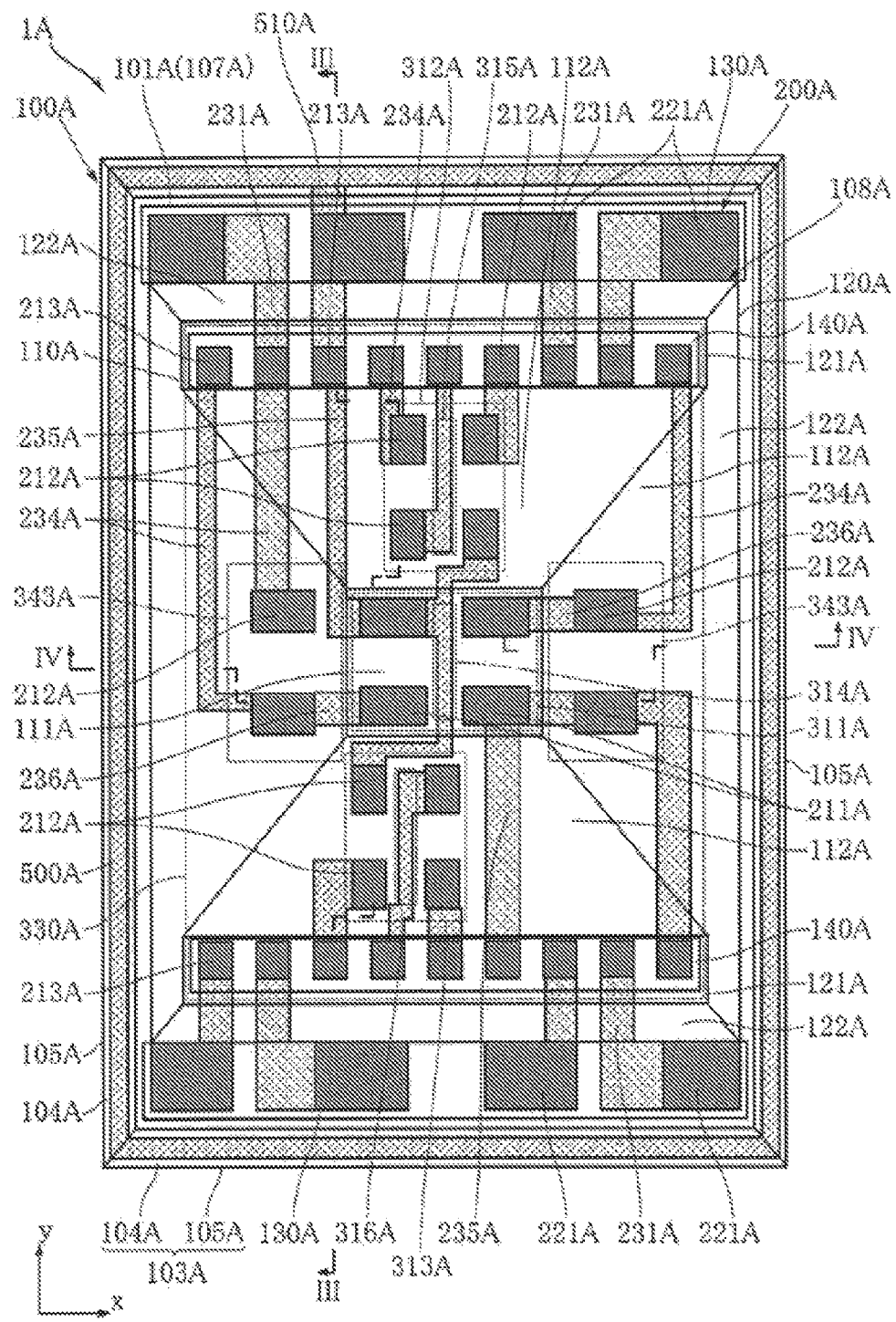
FIG. 2 is a top view illustrating the main portion of the semiconductor device of FIG. 1.
Figure 3:
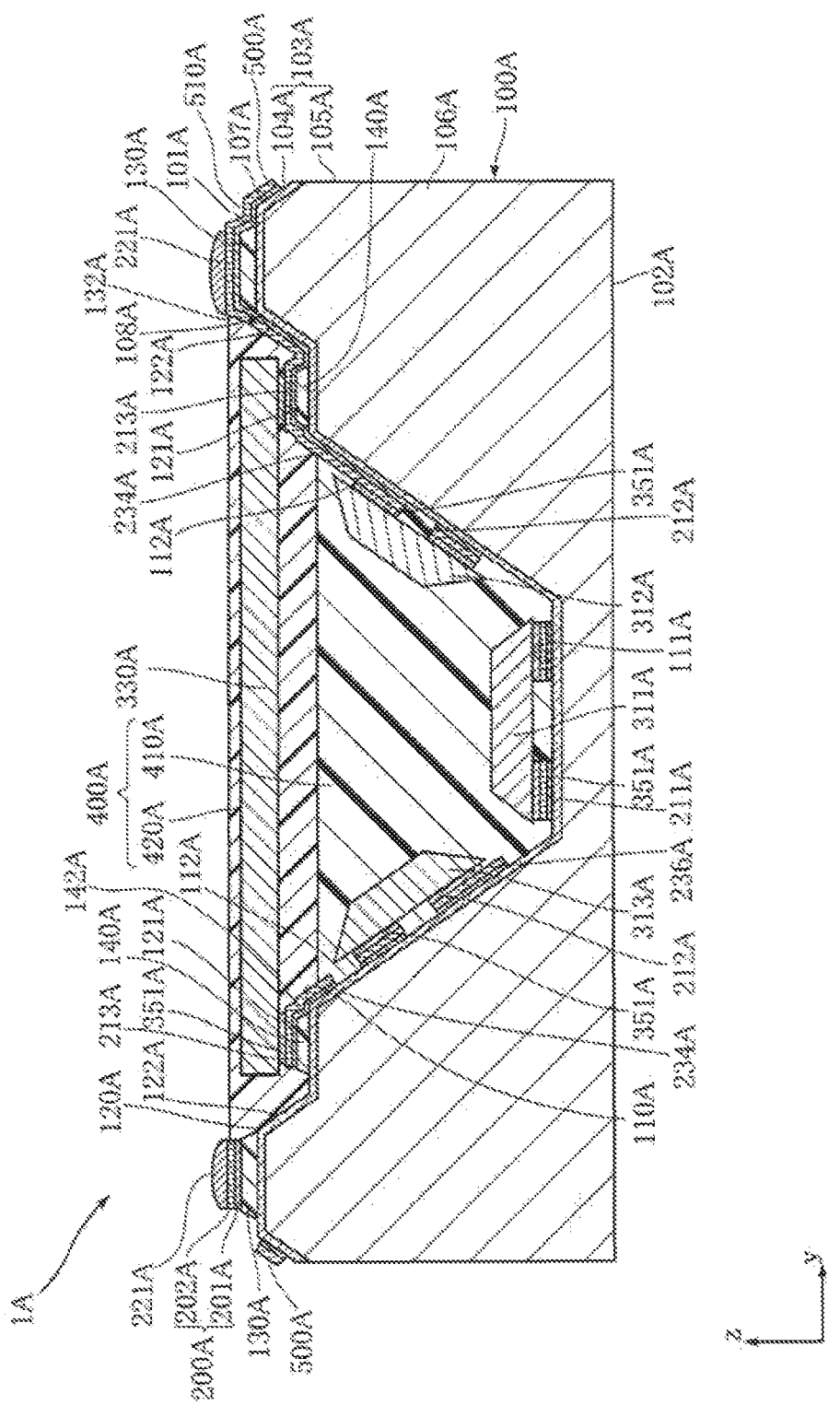
FIG. 3 is a cross-sectional view taken along the line in FIG. 2.
Figure 4:
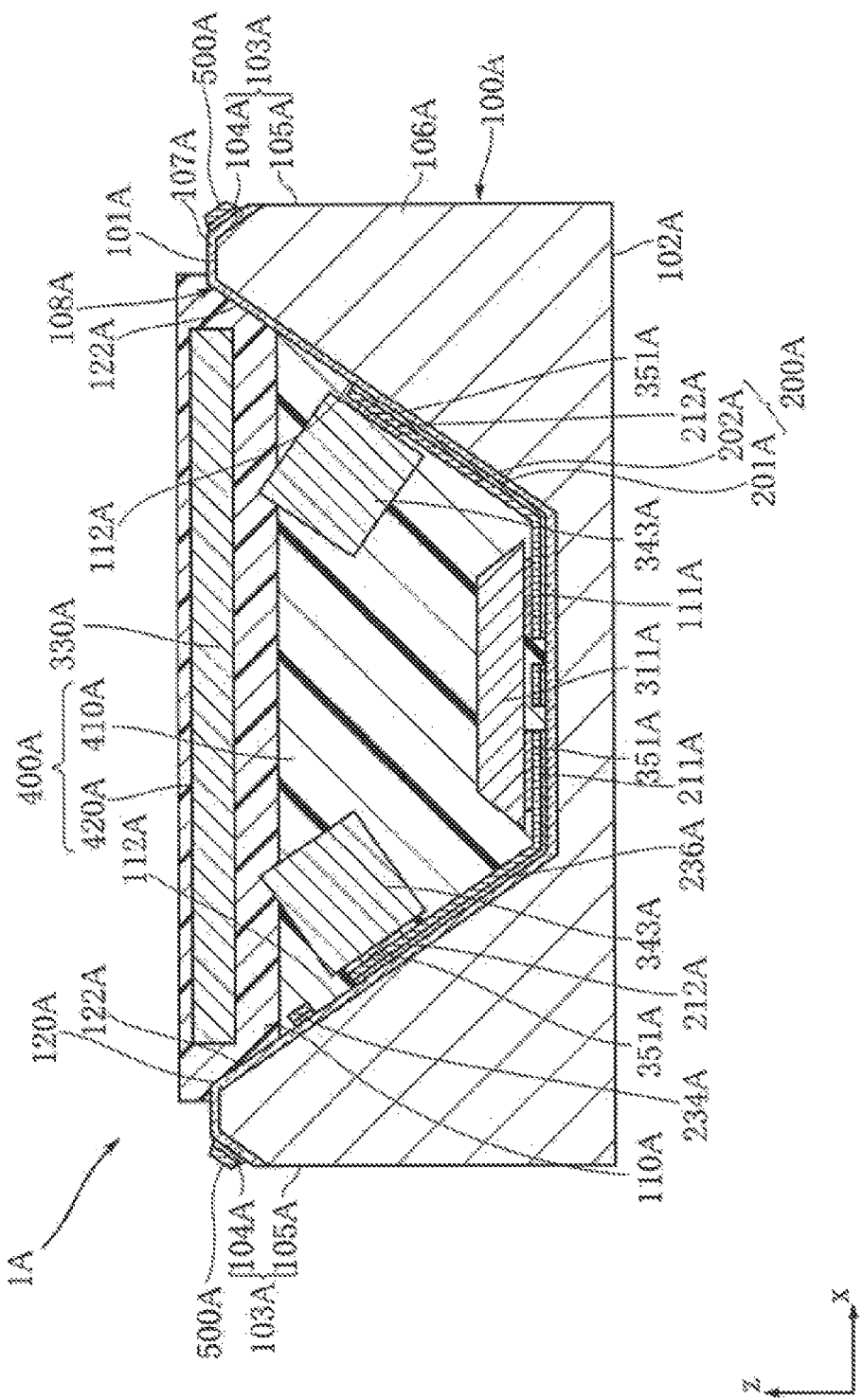
FIG. 4 is a cross-sectional view taken along the line Iv-Iv in FIG. 2.

FIGS. 1 to 4 illustrate a semiconductor device according to the first embodiment of the present invention. The semiconductor device 1A according to this embodiment comprises a substrate 100A, resin forming portions 130A and 140A, a wiring layer 200A, three orientation sensor elements 311A, 312A and 313A, an integrated circuit element 330A, two capacitors 343A, a sealing resin 400A, and a metal film 500A. Further, to facilitate the understanding of the drawings, in FIG. 1 and FIG. 2, the sealing resin 400A is omitted, and said three orientation sensor elements 311A, 312A and 313A, the integrated circuit element 330A and said two capacitors 343A are illustrated with dashed lines. FIG. 3 is a cross-sectional view of the yz plane taken along line III-III in FIG. 2, while FIG. 4 is a cross-sectional view of the zx plane taken along line Iv-Iv in FIG. 2.

The semiconductor device 1A, by comprising the configuration described below, is configured to detect the orientation in three directions, and can be used as a surface-mount orientation detection module. As an example, the plan view dimension of the illustrative semiconductor device 1A is about 1.5 mm×2.0 mm, while the thickness thereof is about 0.6 mm.

The substrate 100A is the base for forming the semiconductor device 1A, and comprises a base material 106A and an insulating layer 107A. The substrate 100A comprises a main surface 101A, a back surface 102A, four outer lateral faces 103A and a recess 108A. The thickness of the substrate 100A is, for example, about 600 µm. Further, in the present embodiment, the main surface 101A and back surface 102A are on the opposite side in the z direction, and the z direction is equivalent to the thickness direction of the semiconductor device 1A. Also, both the x direction and y direction are perpendicular to the z direction.

The base material 106A comprises monocrystalline semiconductor material, and in the present embodiment, comprises monocrystalline silicon. Also, the insulating layer 107A in the present embodiment comprises $SiO_2$. Further, the material of the base material 106A is not limited to silicon, as long as it can be used to form the recess 108A described below. The insulating layer 107A covers a portion of the base material 106A that is faced by the opposite side of the back surface 102A. The thickness of the insulating layer 107A is, for example, about 0.1 to 1.0 µm.

Figure 5:
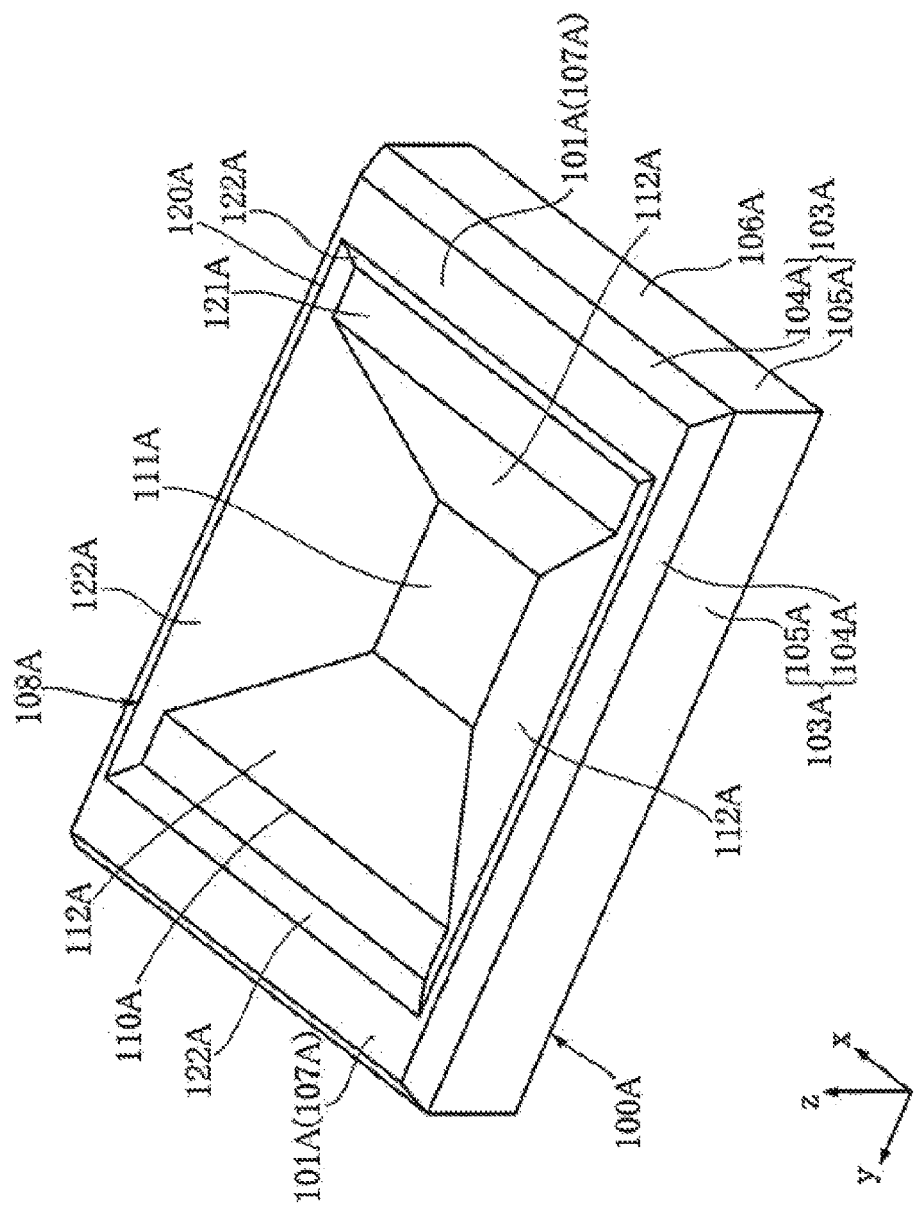
FIG. 5 is a stereogram illustrating the substrate of the semiconductor device in FIG. 1.

FIG. 5 is a stereogram illustrating the substrate 100A. In the present embodiment, the surface (100) of the base material 106A is used as the main surface 101A. The recess 108A is depressed from the main surface 101A toward the back surface 102A. In the present embodiment, the recess 108A comprises a first recess 110A and a second recess 120A. The first recess 110A is disposed at a side that is closer to the back surface 102A, and comprises a first bottom surface 111A and four first inclined inner lateral faces 112A. The second recess 120A is closer to the side of the main surface 101A than the first recess 110A is, and comprises two second bottom surfaces 121A and four second inclined inner lateral faces 122A. The shapes of the first recess 110A and second recess 120A are dependent on the shape of surface (100) that is used as the main surface 101A.

Due to the formation of the recess 108A, the main surface 101A, when viewing from the top, has the shape of a rectangular ring. Specifically, the two portions of the main surface 101A that are separated by the recess 108A in the y direction are configured to be greater than the two portions of the main surface 101A that are separated by the recess 108A in the x direction.

The first recess 110A has a rectangular shape in the plan view. The depth of the first recess 110A is, for example, about 440 µm. The first bottom surface 111A has a rectangular shape in the plan view. The four first inclined inner lateral faces 112A surround the first bottom surface 111A in the plan view, and the portion at which each first inclined inner lateral face 112A is connected with the first bottom surface 111A is substantially configured to have a trapezoid shape. Each first inclined inner lateral face 112A is inclined relative to the first bottom surface 111A. In the present embodiment, the first inclined inner lateral face 112A is inclined in relative to the xy plane with an inclined angle of about 55°. Further, the first inclined inner lateral face 112A is substantially in a trapezoid shape, and the inclined angle of about 55° is dependent on the surface (100) that is used as the main surface 101A.

The second recess 120A has a rectangular shape in the plan view. The depth of the second recess 120A is, for example, about 120 µm. The two second bottom surfaces 121A are rectangular in shape in the plan view, with the first recess 110A being disposed therebetween. Also, each of the second bottom surfaces 121A is connected with the first inclined inner lateral face 112A. The four second inclined inner lateral faces 122A surround said two second bottom surfaces 121A, as viewed from the plan view, and are substantially trapezoid in shape. Each second inclined inner lateral face 122A is inclined relative to the second bottom surface 121A. In the present embodiment, the second inclined inner lateral face 122A is inclined in relative to the xy plane with an inclined angle of about 55°. Further, the second inclined inner lateral face 122A is substantially in a trapezoid shape, and the inclined angle of about 55° is dependent on the surface (100) that is used as the main surface 101A.

The resin forming portions 130A and 140A are configured to form a step difference on the substrate 100A, and are formed on the substrate 100A (insulating layer 107A). In the present embodiment, the resin forming portions 130A are formed on the main surface 101A, thereby forming portions for use as the base for the external terminals 221A. The resin forming portions 130A are formed at the two portions of the main surface 101A that are disposed separately by the recess 108A in the y direction. The height of the resin forming portion 130A is, for example, about 50 µm. The resin forming portions 140A are formed on said two second bottom surfaces 121A of the second recess 120A, respectively, thereby forming portions for loading the integrated circuit element 330A. In the present embodiment, the height of the resin forming portion 140A is, for example, about 50 µm. Each of said resin forming portions 130A and 140A comprises a flat top surface, and a lateral surface 132A or 142A that is inclined in relative to the top surface. Illustrative examples of materials suitable for forming said resin forming portions 130A and 140A include, for example, epoxy resins, phenolic resins, polyimide resins, polybenzoxazole (PBO) resins, and silicone resins. The resin forming portions 130A and 140A can be either transparent resins or opaque resins; however, in the present embodiment, the opaque resin is preferred.

The wiring layer 200A is configured to carry the three orientation sensor elements 311A, 312A and 313A, the integrated circuit element 330A, and the two capacitors 343A, as well as other components for forming the input/output circuit(s) thereof. The wiring layer 200A is primarily formed on to the insulating layer 107A, and in the present embodiment, it is a multilayered structure comprising a barrier/seed layer 201A and a plating layer 202A.

The barrier/seed layer 201A is configured to form a so-called basal layer for forming the desired plating layer 202A, and is primarily formed on the insulating layer 107A. The barrier/seed layer 201A comprises a Ti layer (e.g., for use as the barrier layer) formed on the insulating layer 107A and a Cu layer (e.g., for use as the seed layer) stacked on the barrier layer. The barrier/seed layer 201A is formed, for example, by sputtering. In the present embodiment, the barrier/seed layer 201A is formed on the insulating layer 107A and on specific portions of the resin forming portions 130A and 140A.

The plating layer 202A comprises, for example, Cu, and is formed by electroplating with the barrier/seed layer 201A. The thickness of the plating layer 202A is, for example, about 5 µm.

In the present embodiment, the wiring layer 200A comprises one or more first bottom surface pads 211A, first inclined inner lateral face pads 212A, resin forming portion pads 213A, external terminals 221A, and connection paths 231A, 234A, 235A and 236A.

The first bottom surface pads 211A are formed at the first bottom surface 111A of the first recess 110A, and are, for example, substantially rectangular in shape. In the present embodiment, four first bottom surface pads 211A are formed. In the present embodiment, the first bottom surface pads 211A are configured to carry the orientation sensor element 311A.

The first inclined inner lateral face pads 212A are formed at the first inclined inner lateral face 112A of the first recess 110A, and are, for example, substantially rectangular in shape. In the present embodiment, four first inclined inner lateral faces pads 212A are formed on each of the two first inclined inner lateral faces 112A that are disposed separately by the first bottom surface 111A in the y direction. Said two groups of four first inclined inner lateral faces pads 212A are configured to carry the orientation sensor elements 312A and 313A, respectively. Also, in the present embodiment, two first inclined inner lateral faces pads 212A are formed on each of the two first inclined inner lateral faces 112A that are disposed separately by the first bottom surface 111A in the x direction. Said two groups of two first inclined inner lateral faces pads 212A are configured to carry each of said two capacitors 343A.

The resin forming portion pads 213A are formed at the resin forming portion 140A of the second bottom surface 121A, and are, for example, substantially rectangular in shape. In the present embodiment, a plurality of resin forming portion pads 213A are formed on the resin forming portion 140A of each second bottom surface 121. More specifically, nine resin forming portion pads 213A are disposed separately along the x direction at each of the two sides separated by the first recess 110A in the y direction. In the present embodiment, the resin forming portion pad 213A is configured to carry the integrated circuit element 330A.

The external terminals 221A are formed at the resin forming portion 130A on the main surface 101A, and are configured to surface mount the semiconductor device 1A on, for example, a circuit substrate of an electronic apparatus (not shown in the drawings). In the present embodiment, for each of the resin forming portions 130A that are disposed at two portions separated by the recess 108A in the y direction on the main surface 101A, four external terminals 221A are formed thereon. The external terminals 221A are disposed on the barrier/seed layer 201A and the plating layer 202A, thereby forming a bump structure, which is formed, for example, by electroless plating of metals such as, Ni, Pd, Au, etc. In this way, as illustrated in FIG. 3, the external terminal 221A has a shape that protrudes in the z direction.

The connection paths 231A, 234A, 235A and 236A are configured to form the paths that allows the interconnection among the first bottom surface pads 211A, the first inclined inner lateral face pads 212A, the resin forming portion pads 213A, and the external terminals 221A.

The connection path 231A forms the path from the main surface 101A (the resin forming portion 130A) to the second bottom surface 121A, and is primarily responsible for the electric connection between the external terminals 221A and the resin forming portion pads 213A. As illustrated in FIG. 2, in the present embodiment, each connection path 231A reaches the second bottom surface 121A via the second inclined inner lateral face 122A of the second recess 120A. The portion of each connection path 231A that is formed on the second inclined inner lateral face 122A extends along the y direction in the plan view, and is not inclined in relative to the y direction.

The connection path 234A forms the path from the second bottom surface 121A to the first inclined inner lateral face 112A, and allows the electric connection between the resin forming portion pads 213A and the first inclined inner lateral face pads 212A. In the present embodiment, some of the connection paths 234A extend along the y direction in the plan view. Further, the other connection paths 234A are bent in the first inclined inner lateral face 112A.

The connection path 235A forms the path from the second bottom surface 121A via the first inclined inner lateral face 112A to the first bottom surface 111A, and allows the electric connection between the resin forming portion pads 213A and the first bottom surface pads 211A. In the present embodiment, one connection path 235A extends along the y direction in the plan view. Also, the other connection paths 235A are bent in the first inclined inner lateral face 112A.

The connection path 236A forms the path from the first inclined inner lateral face 112A to the first bottom surface 111A, and allows the electric connection between the first inclined inner lateral face pads 212A and the first bottom surface pads 211A.

Further, in the present embodiment, the second external terminal 221A at the upper-left corner in the drawing of FIG. 2 is used as the so-called ground terminal. Also, the connection paths 231A, the resin forming portion pad 213A, the connection path 235A, the first bottom surface pad 211A, the connection path 236A, and the first inclined inner lateral face pad 212A that are electrically connected to the external terminals 221A are connected to the ground.

As illustrated in FIG. 2, when viewing from the z direction, the four outer lateral faces 103A of the substrate 100A surround the main surface 101A, and are arranged as a rectangular ring. More specifically, each outer lateral face 103A comprises an inclined outer lateral face 104A and a vertical outer lateral face 105A. The inclined outer lateral face 104A is interposed between the main surface 101A and the vertical outer lateral face 105A, and is inclined in relative to one of the main surface 101A and the vertical outer lateral face 105A. In the present embodiment, the inclined outer lateral face 104A is connected with the main surface 101A, and the vertical outer lateral face 105A is connected with the back surface 102A. In the present embodiment, the inclined outer lateral face 104A forms an inclined angle of about 55° in relative to the xy plane. Further, the inclined angle of about 55° is dependent on the surface (100) that is used as the main surface 101A.

Here, the inclined angle between the inclined outer lateral face 104A and the xy plane (the main surface 101A) is the same as the inclined angle between the first inclined inner lateral face 112A and the main surface 101A and the inclined angle between the second inclined inner lateral face 122A and the main surface 101A. The detailed description is provided below; however, these inclined outer lateral faces 104A, the first inclined inner lateral faces 112A, and the second inclined inner lateral faces 122A are expected to be batch manufactured with etching, and hence, are set with the same angle. The inevitable variation due to the unevenness of the etching conditions are comprised in the equivalent scope of the claimed invention.

The vertical outer lateral face 105A substantially forms a right angle in relative to the main surface 101A, and is substantially parallel with the zx plane or yz plane. In the present embodiment, the inclined outer lateral face 104A is smoother than the vertical outer lateral face 105A is. Further, the above-mentioned condition in which the inclined outer lateral face 104A is smoother than the vertical outer lateral face 105A is dependent on the manufacturing method of the semiconductor device 1A described below.

The metal film 500A is formed on the inclined outer lateral face 104A. In the present embodiment, as illustrated in FIG. 2, the metal film 500A covers most portion of the inclined outer lateral face 104A, and when viewing from the z direction, the metal film 500A, as a whole, surrounds the main surface 101A. In the present embodiment, the metal film 500A, as a whole, forms an integral ring. The metal film 500A comprises the connection path 510A that is configured to connect with the external terminals. In the present embodiment, the connection path 510A is connected with the second external terminal 221A at the upper-left corner of the drawing in Figure. The external terminal 221A, as described above, is the ground terminal, and hence, the metal film 500A that is electrically connected with the external terminal 221A is connected to the ground, too. The metal film 500A, like the wiring layer 200A, is disposed as a structure comprising the barrier/seed layer 201A and the plating layer 202A. Further, instead of being composed of an integral ring, the metal film 500A may be composed of, for example, a plurality of elements that are respectively connected with one another and disposed as a ring.

The three orientation sensor elements 311A, 312A and 313A respectively comprise detection reference axes that are disposed along different directions, and are configured to detect the position of the semiconductor device 1A in relative to the earth magnetism. In the present embodiment, the orientation sensor elements 311A, 312A and 313A, as illustrated in FIG. 2, comprise magnetic cores 314A, 315A and 316A. The magnetic cores 314A, 315A and 316A are club-like elements made of metal and extend along a specific direction, and the directions of the long sides thereof is equivalent to the detection reference axes of the orientation sensor elements 311A, 312A and 313A. The orientation sensor elements 311A, 312A and 313A further comprise coils (omitted in the drawings) formed by encircling the magnetic cores 314A, 315A and 316A. The thickness of each of the orientation sensor elements 311A, 312A and 313A is, for example, about 80 μm.

In the present embodiment, the orientation sensor element 311A is to supported by the first bottom surface 111A, and is loaded by four solders 351A for separating the first bottom surface pad 211A. Due to such loading configuration, the magnetic core 314A of the orientation sensor element 311A is disposed along the y direction.

The orientation sensor element 312A is supported by the first inclined inner lateral face 112A at the upper side in the drawing of FIG. 2, and is loaded by four solders 351A for separating the first inclined inner lateral faces pad 212A. Due to such loading configuration, the magnetic core 315A of the orientation sensor element 312A forms a right angle with respect to the x direction, and is disposed along the direction of the yz plane. This direction is parallel with the first inclined inner lateral face 112A for supporting the orientation sensor element 312A.

The orientation sensor element 313A is supported by the first inclined inner lateral face 112A at the lower side in the drawing of FIG. 2, and is loaded by four solders 351A for the separating first inclined inner lateral faces pad 212A. Due to such loading configuration, the magnetic core 316A of the orientation sensor element 313A forms a right angle with respect to the x direction, and is disposed along the direction of the yz plane. This direction is parallel with the first inclined inner lateral face 112A for supporting the orientation sensor element 313A.

Also, in the present embodiment, the top surfaces of the orientation sensors 311A, 312A and 313A that are opposite to the bottom surface of the substrate 100A, are set to be smaller than the bottom surface. Also, the lateral face that connects said bottom surface and top surface is inclined in relative to the bottom surface in a direction away from the top surface.

The integrated circuit element 330A is configured to control the orientation detection process using said three orientation sensor elements 311A, 312A and 313A. In the present embodiment, the integrated circuit element 330A is configured as a so-called ASIC (Application Specific Integrated Circuit) element, and the thickness thereof is about 80 to 100 μm.

The integrated circuit element 330A is separated from the resin forming portion 140A and supported by the second bottom surface 121A, and is loaded by the solder 351A for separating the resin forming portion pad 213A. As illustrated in FIG. 2, the integrated circuit element 330A is configured to be loaded by a plurality of resin forming portion pads 213A that are separated along the y direction so that the two sides of the integrated circuit element 330A are supported. Also, in the plan view, the integrated circuit element 330A removes a portion of the first recess 110A so that it covers the most portion of the first recess 110A. Also, in the plan view, the integrated circuit element 330A superimposes all of the orientation sensor elements 311A, 312A, and 313A; further, it also superimposes with the two capacitors 343A. As illustrated in FIG. 3 and FIG. 4, the integrated circuit element 330A, except the upper portion, is accommodated in the second recess 120A in the z direction. On the other hand, the upper portion of the integrated circuit element 330A protrudes above the second recess 120A.

The orientation detection process using the orientation sensor elements 311A, 312A and 313A is carried out using, for example, the method described below. As described above, the orientation sensor elements 311A, 312A and 313A comprise magnetic cores 314A, 315A and 316A that are respectively encircled by coils. Since the orientation sensor elements 311A, 312A and 313A are respectively disposed in the above-described configurations, the orientation sensor elements 311A, 312A and 313A (i.e., the magnetic cores 314A, 315A and 316A) are disposed along different directions. The directions in which these magnetic cores 314A, 315A and 316A are disposed are stored in the integrated circuit element 330A as a known information.

The two capacitors 343A are supported by the first inclined inner lateral face 112A, and separated from each other by the orientation sensor element 311A in the x direction. In this way, the two capacitors 343A and the orientation sensor element 311A are aligned in the x direction.

The semiconductor device 1A can employ the method disclosed in, for example, the Japan patent application publication No. 2006-47267, which uses the orientation sensor elements 311A, 312A and 313A, to perform a steric detection (three-axial detection) to determine its position in relative to the earth magnetism. The integrated circuit element 330A, based on a command from an external source or autonomously, uses the orientation detection result from the semiconductor device 1A as a signal and outputs the signal via the external terminals 221A.

The sealing resin 400A covers the orientation sensor elements 311A, 312A and 313A and the integrated circuit element 330A, and is filled in the recess 108A. In the present embodiment, the sealing resin 400A comprises a first sealing resin 410A and a second sealing resin 420A.

The first sealing resin 410A is substantially filled in the first recess 110A, and covers the entirety of the orientation sensor elements 311A, 312A and 313A. On the other hand, the first sealing resin 410A does not cover the resin forming portion pads 213A and the integrated circuit element 330A.

The second sealing resin 420A is substantially filled in the second recess 120A, and covers the entirety of the integrated circuit element 330A. On the other hand, the second sealing resin 420A exposes the external terminals 221A.

The materials suitable for use as the first sealing resin 410A and the second sealing resin 420A, include, but are not limited to, epoxy resins, phenolic resins, polyimide resins, polybenzoxazole (PBO) resins, and silicone resins. The first sealing resin 410A and the second sealing resin 420A are preferably either the transparent resins or the opaque resins; however, in the present embodiment, it is preferably opaque resins.

Next, the manufacturing process of the semiconductor device 1A is described below with referencing to FIG. 6 to FIG. 27. Further, the cross-sectional views in FIG. 6 to FIG. 26 illustrate the yz plane taken along line in FIG. 2.

Figure 6:
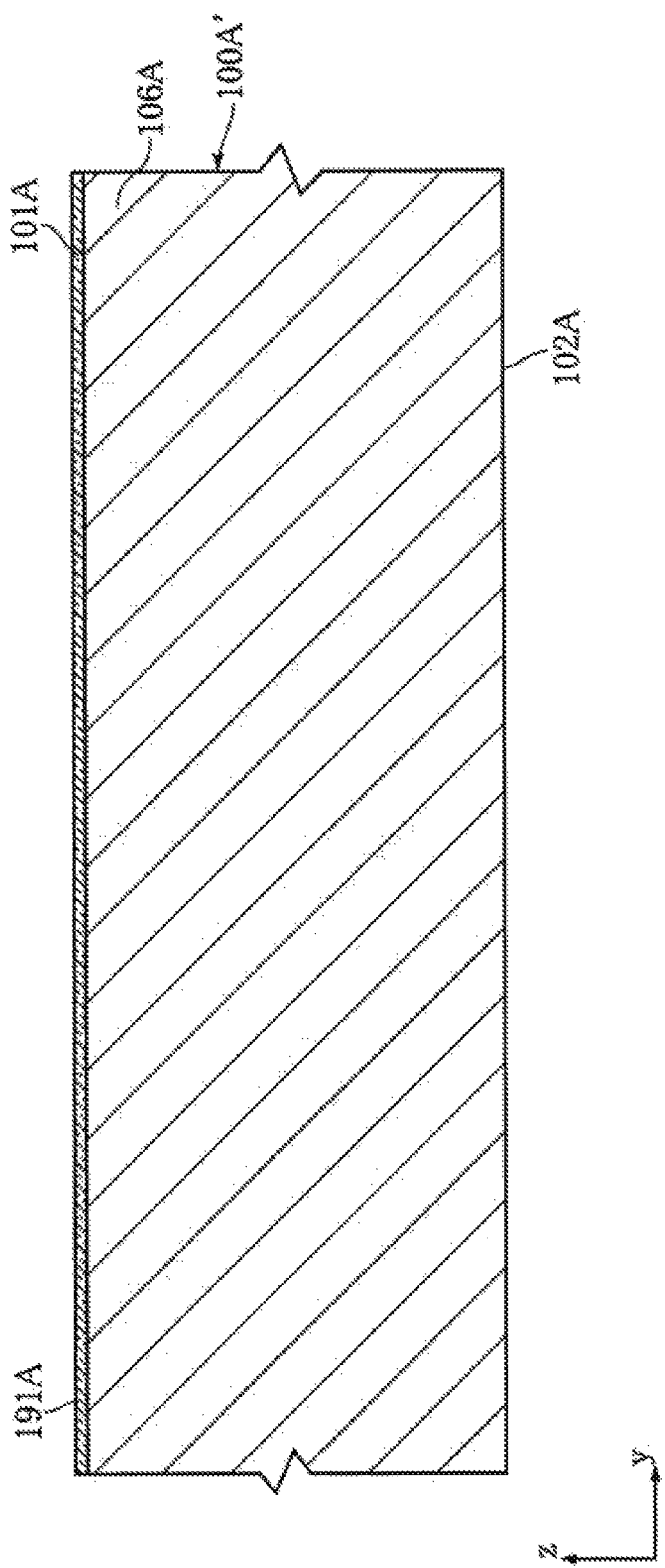
FIG. 6 is a cross-sectional view illustrating a main portion of the semiconductor device in FIG. 1 during the manufacturing process.

First, as illustrated in FIG. 6, the substrate material 100A' is prepared. The substrate material 100A' comprises the monocrystalline semiconductor material, and in the present embodiment, it comprises monocrystalline silicon. The thickness of the substrate material 100A' is, for example, about 600 μm. The size of the substrate material 100A' is sufficient to obtain multiple substrates 100A of the semiconductor devices 1A. That is, the premise in the subsequent manufacturing process is the batch manufacture of multiple semiconductor devices 1A. Even though the manufacturing process for preparing one semiconductor device 1A can also be used; however, considering the industrial efficiency, methods for batch manufacture of multiple semiconductor devices 1A are more realistic.

The substrate material 100A' comprises a main surface 101A and a back surface 102A that face opposite sides in the z direction. In the present embodiment, the crystalline orientation is used as the surface (100), the surface (100) is used as the main surface 101A. Next, a photomask layer 191A comprising $SiO_2$ is formed by, for example, oxidizing the main surface 101A. The thickness of the photomask layer 191A is, for example, about 0.7 to 1.0 μm.

Figure 7:
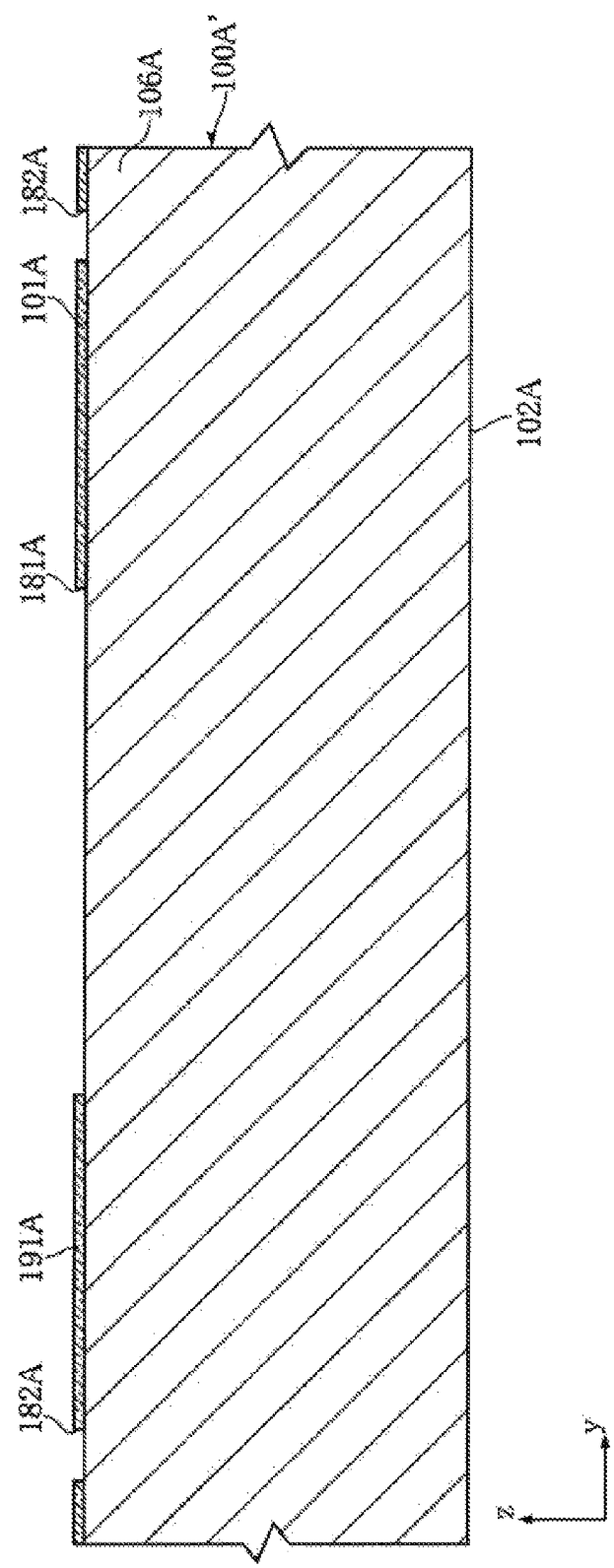
FIG. 7 is a cross-sectional view illustrating a main portion of the semiconductor device in FIG. 1 during the manufacturing process.

Then, as illustrated in FIG. 7, the photomask layer 191A is patterned by, such as, etching. In this way, openings 181A and 182A are formed in the photomask layer 191A. The shape and size of openings 181A and 182A are determined depending on the desired shape and size of the resultant first recess 110A and inclined outer lateral face 104A. The shape of the opening 181A is, for example, rectangular, and the opening 182A, when viewing from the z direction, surrounds the opening 181A and forms a rectangular ring.

Figure 8:
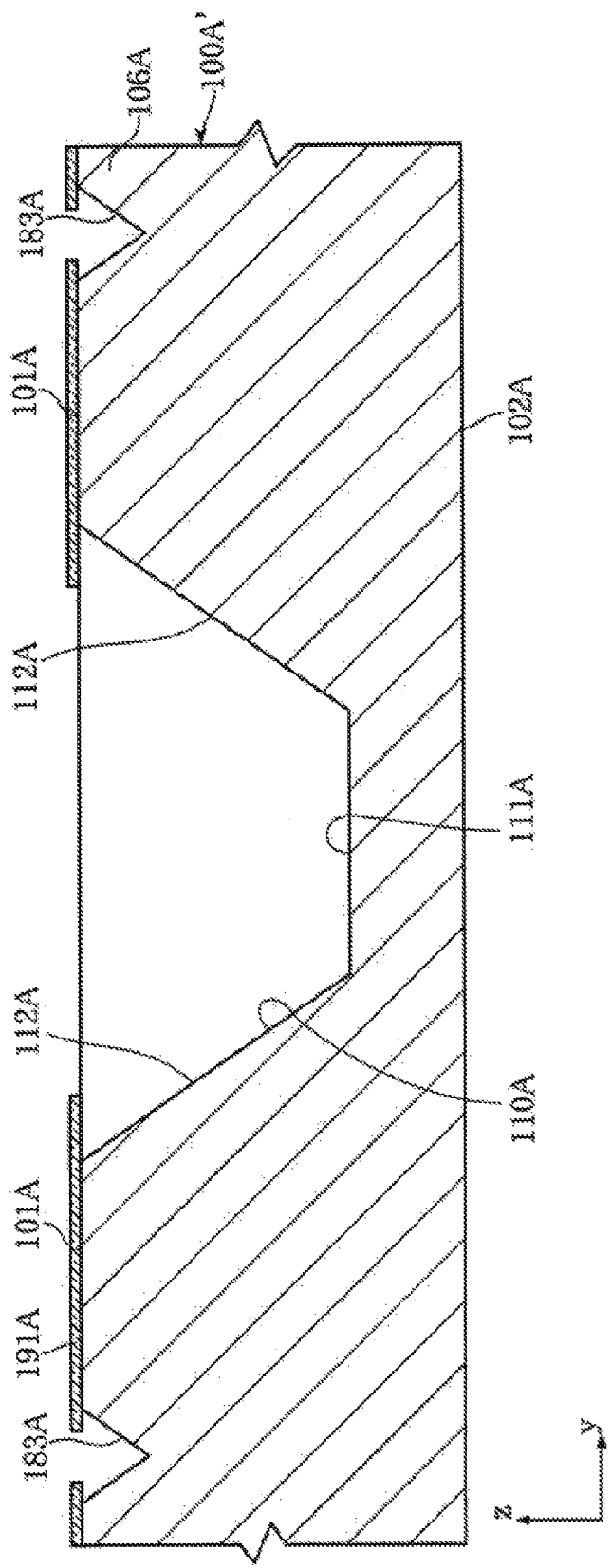
FIG. 8 is a cross-sectional view illustrating a main portion of the semiconductor device in FIG. 1 during the manufacturing process.
Figure 9:
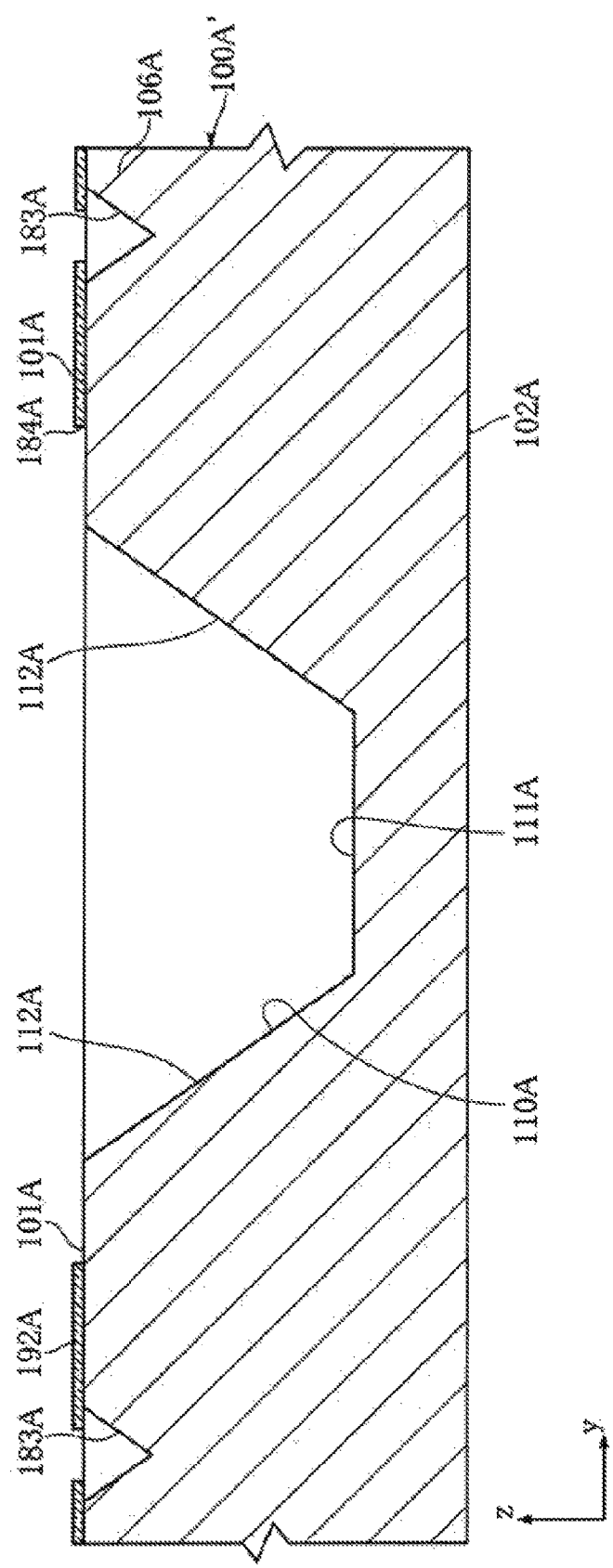
FIG. 9 is a cross-sectional view illustrating a main portion of the semiconductor device in FIG. 1 during the manufacturing process.

Subsequently, as illustrated in FIG. 8, the first recess 110A and inclined slot 183A are formed. The formation of the first recess 110A and the formation of the inclined slot 183A can be carried out simultaneously by, for example, anisotropic etching using KOH. KOH is one example of basic etching solutions capable of achieving satisfactory anisotropic etching to monocrystalline silicon. By performing anisotropic etching, the first recess 110A comprising a first bottom surface 111A and four first inclined inner lateral faces 112A and inclined slot 183A comprising two opposing inclined faces (the two inclined faces opposing to each other in the y direction in FIG. 8) are formed. The inclined angle between the first inclined inner lateral face 112A and the xy plane and the inclined angle between the inclined slot 183A and the xy plane are about 55°, respectively.

Then, by further patterning the photomask layer 191A, a photomask layer 192A comprising the opening 184A is formed. The photomask layer 192A is made so that the area of the opening is greater than that of the photomask layer 191A. The opening 184A is, for example, substantially rectangular in shape. The shape and size of the opening 184A is determined depending on the desired shape and size of the resultant second recess 120A.

Figure 10:
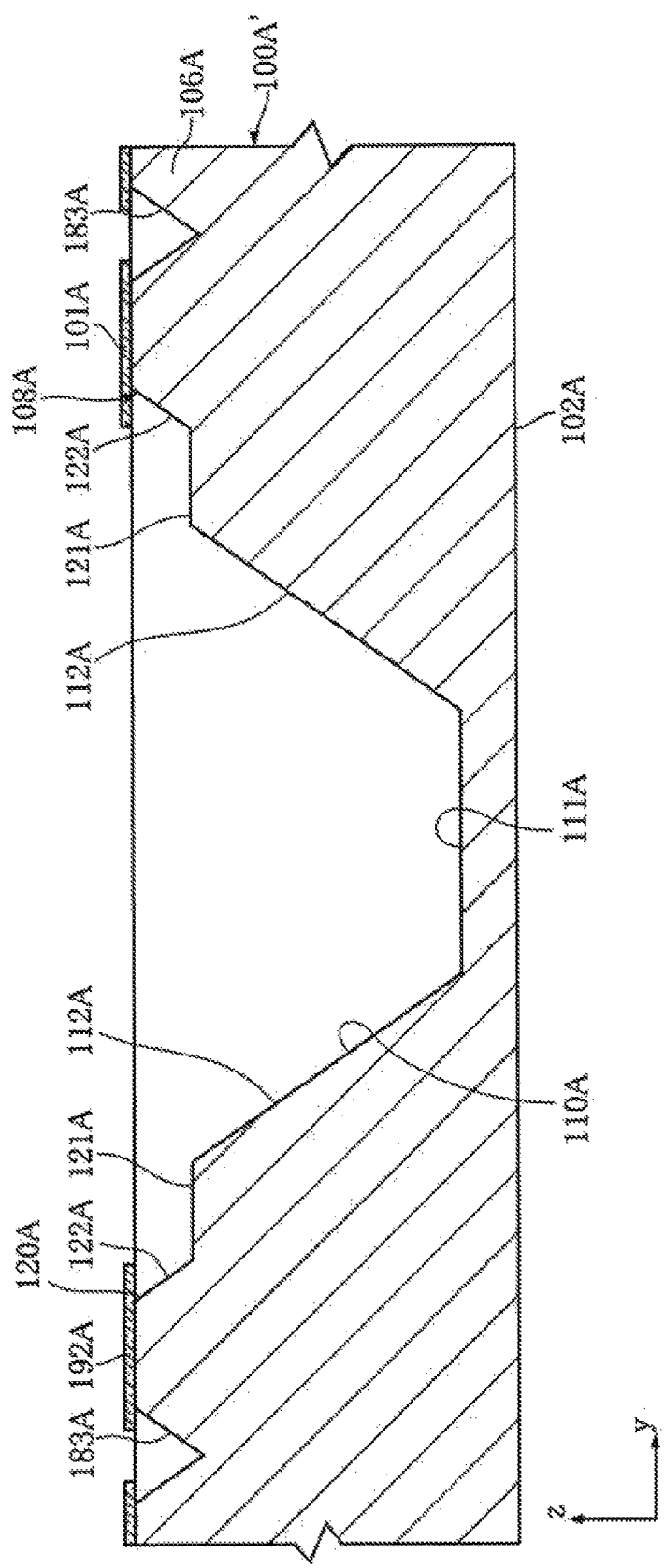
FIG. 10 is a cross-sectional view illustrating a main portion of the semiconductor device in FIG. 1 during the manufacturing process.

Next, as illustrated in FIG. 10, the recess 108A is formed. For example, the recess 108A is formed by using anisotropic etching with KOH. Through the anisotropic etching, the first recess 110A becomes deeper and larger, and forms a new second recess 120A. The second recess 120A comprises two second bottom surfaces 121A separated by the first recess 110A and four second inclined inner lateral faces 122A surrounding the first recess 110A. The second inclined inner lateral face 122A, like the first inclined inner lateral face 112A, forms an inclined angle of about 55° with respect to the xy plane. By performing two anisotropic etching processes as described above, a two-step recess 108A comprising a first recess 110A and a second recess 120A is formed. In the present embodiment, the depth of the first recess 110A is about 440 μm, and the depth of the second recess 120A is about 120 μm.

Figure 11:
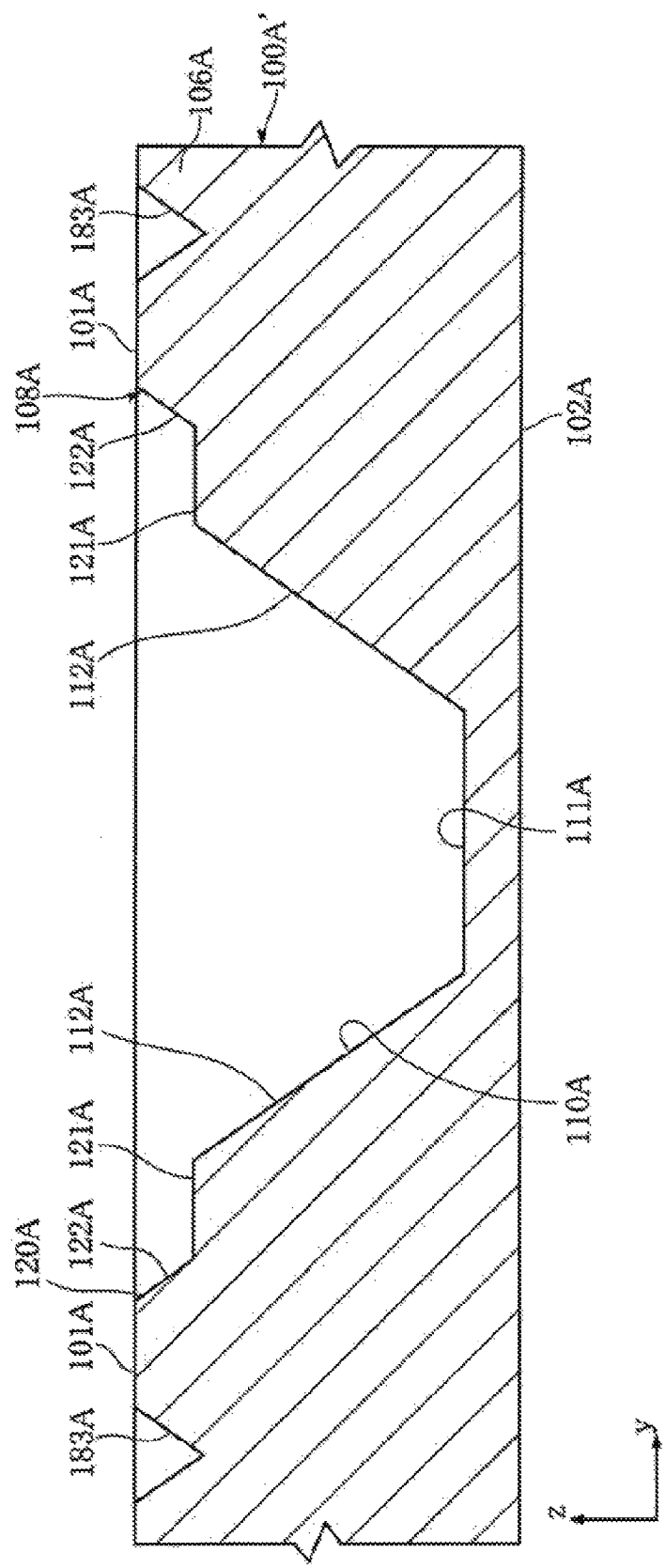
FIG. 11 is a cross-sectional view illustrating a main portion of the semiconductor device in FIG. 1 during the manufacturing process.

Thereafter, as illustrated in FIG. 11, the photomask layer 192A is removed. For example, the removal process is performed by etching with HF.

Figure 12:
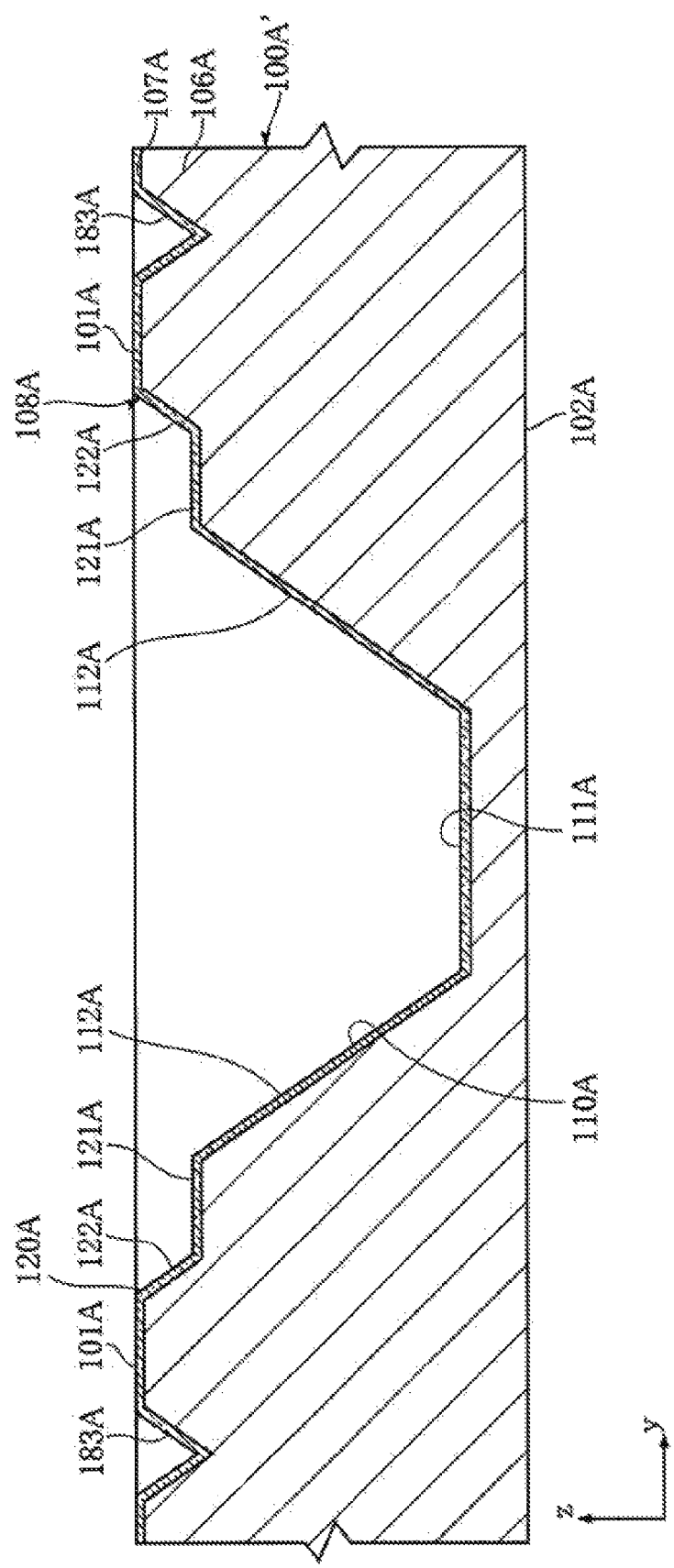
FIG. 12 is a cross-sectional view illustrating a main portion of the semiconductor device in FIG. 1 during the manufacturing process.

Subsequently, as illustrated in FIG. 12, an insulating layer 107A comprising, for example, SiO2 is formed. The formation of the insulating layer 107A is achieved by oxidizing the entirety of the side that is opposite to the back surface 102A of the substrate material 100A'. In this way, the insulating layer 107A with a thickness of, for example, about 0.7 to 1.0 μm is obtained.

Figure 13:
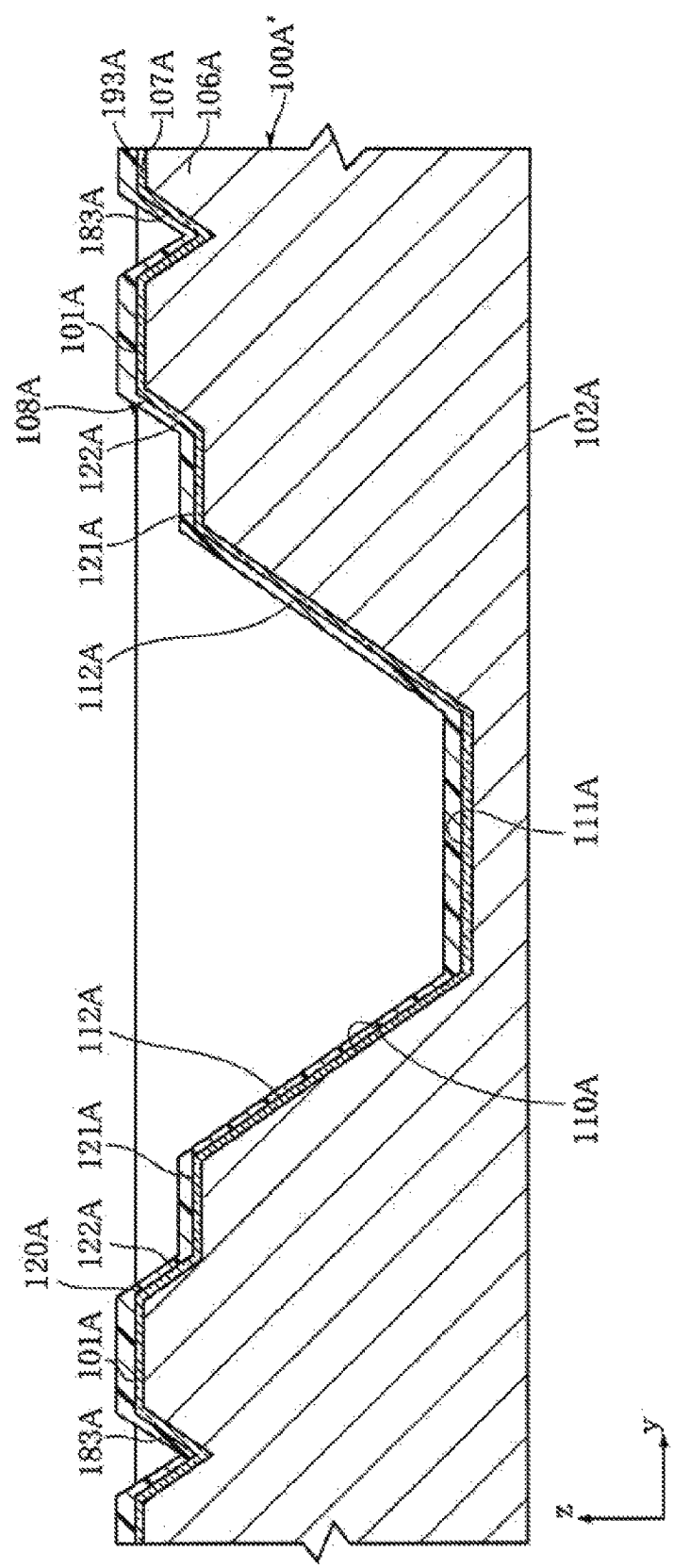
FIG. 13 is a cross-sectional view illustrating a main portion of the semiconductor device in FIG. 1 during the manufacturing process.
Figure 14:
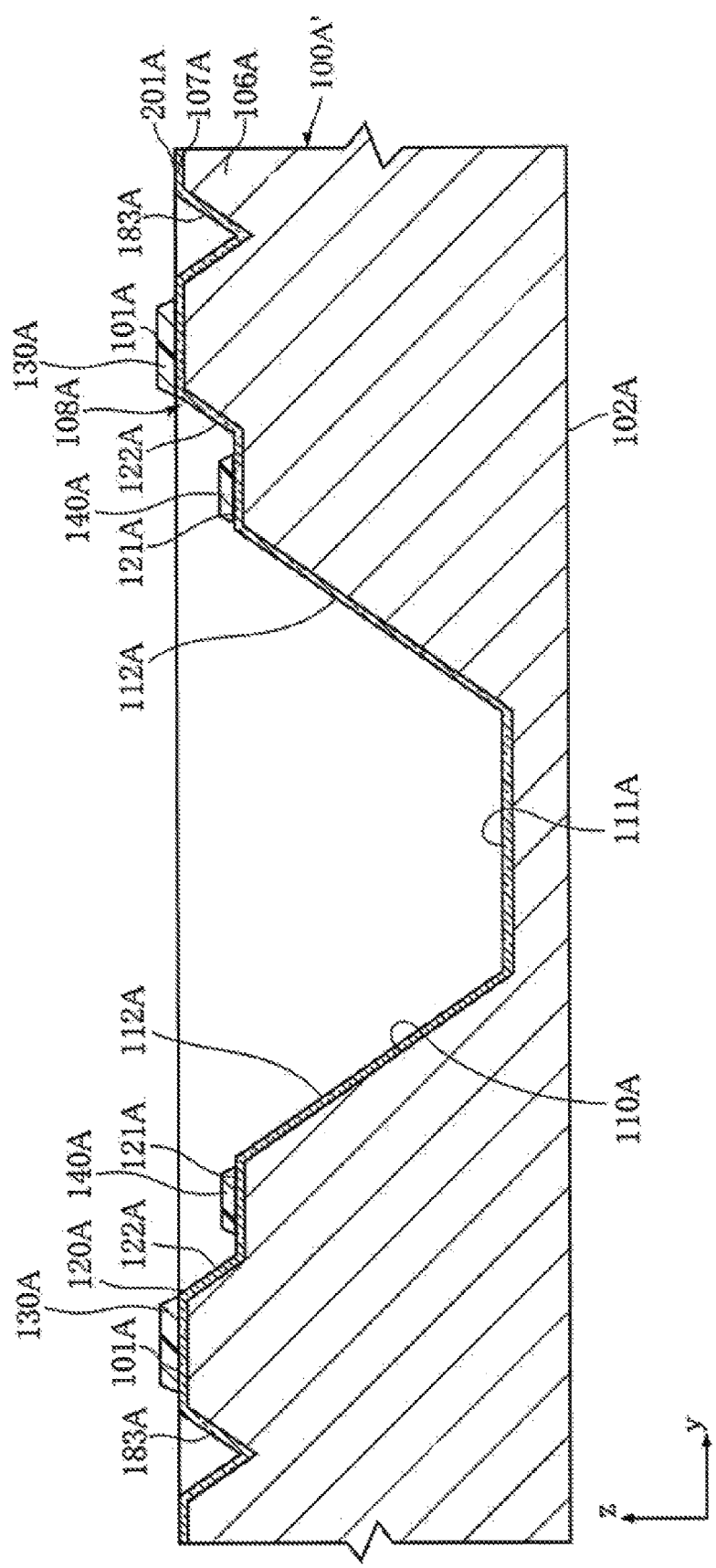
FIG. 14 is a cross-sectional view illustrating a main portion of the semiconductor device in FIG. 1 during the manufacturing process.

Then, as illustrated in FIG. 13, a resin layer 193A is formed. The resin layer 193A is formed by spray coating of, such as, photosensitive epoxy resins. Thereafter, as illustrated in FIG. 14, the resin layer 193A is patterned. The patterning is achieved by, for example, performing the exposing and imaging procedures of photo lithography to the resin layer 193A; in this way, the desired portions are removed. By this patterning step, resin forming portions 130A and 140A are formed at specific positions on the main surface 101A and the second bottom surface 121A.

Figure 15:
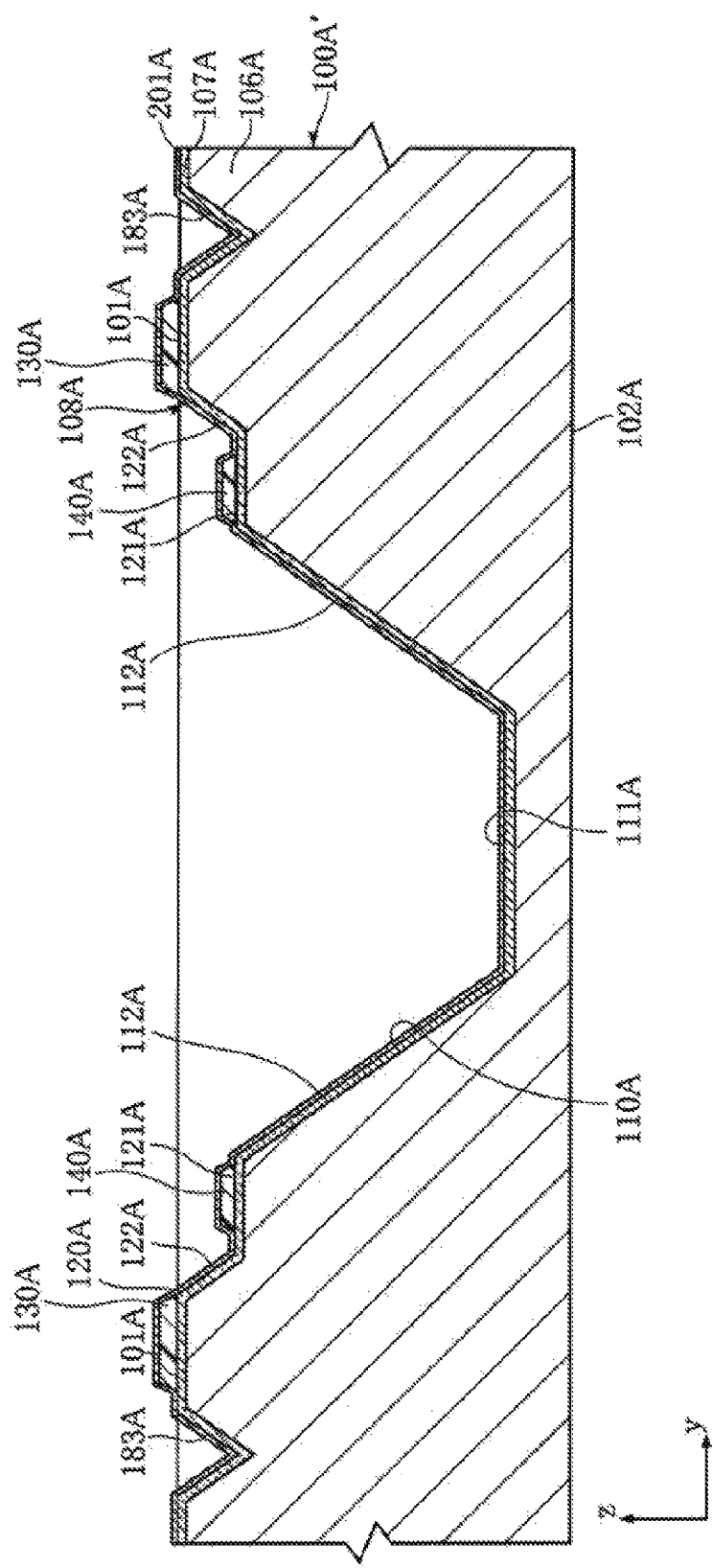
FIG. 15 is a cross-sectional view illustrating a main portion of the semiconductor device in FIG. 1 during the manufacturing process.

Next, as illustrated in FIG. 15, a barrier/seed layer 201A is formed. The barrier/seed layer 201A is formed, for example, by sputtering. Specifically, a layer comprising Ti is formed on the insulating layer 107A by sputtering. The Ti-containing layer is used as the barrier layer. Then, a Cu layer is sputtered on the barrier layer. The Cu-containing layer is used as the seed layer. In this way, the barrier/seed layer 201A is obtained by sputtering.

Figure 16:
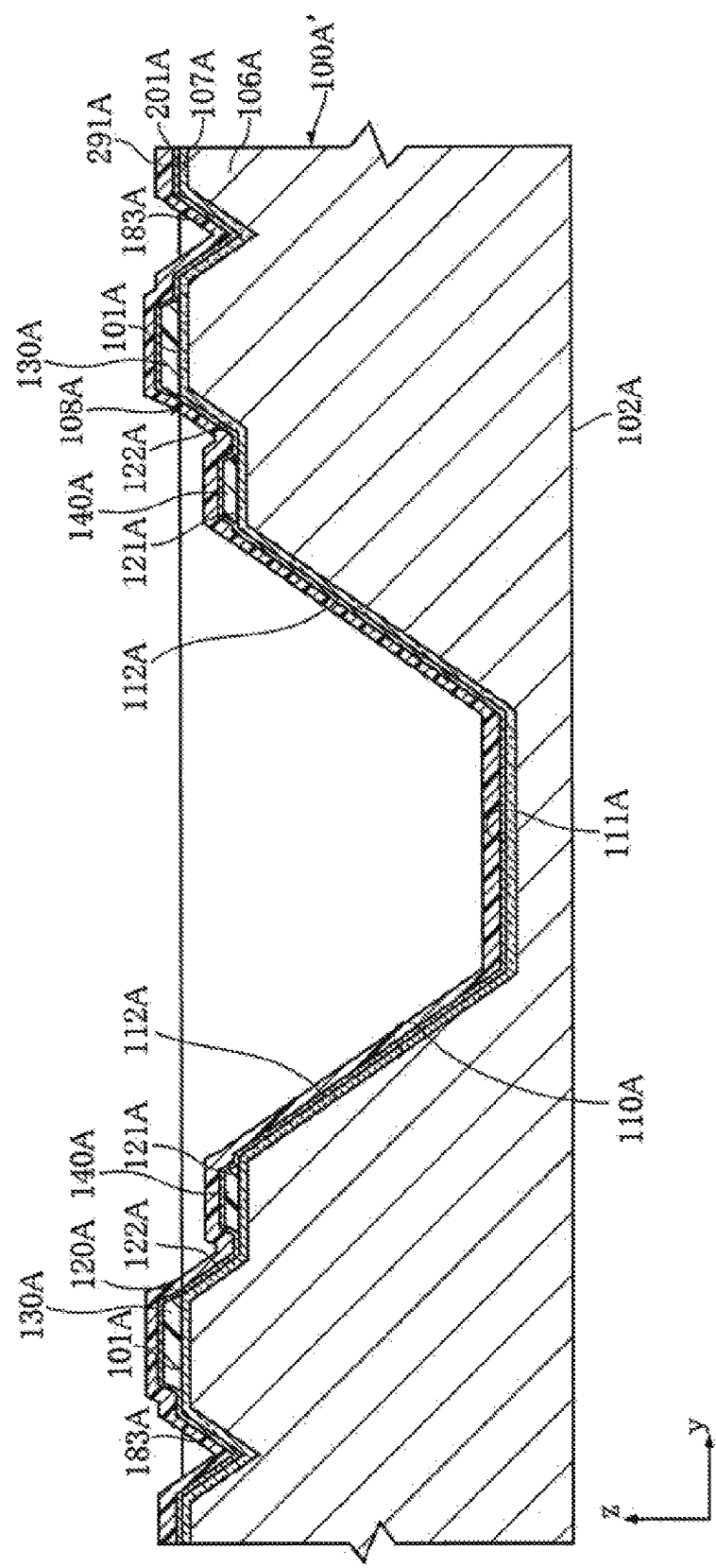
FIG. 16 is a cross-sectional view illustrating a main portion of the semiconductor device in FIG. 1 during the manufacturing process.

Then, as illustrated in FIG. 16, a photomask layer 291A is formed. The photomask layer 291A is formed by spray coating of, such as, photosensitive epoxy resins.

Figure 17:
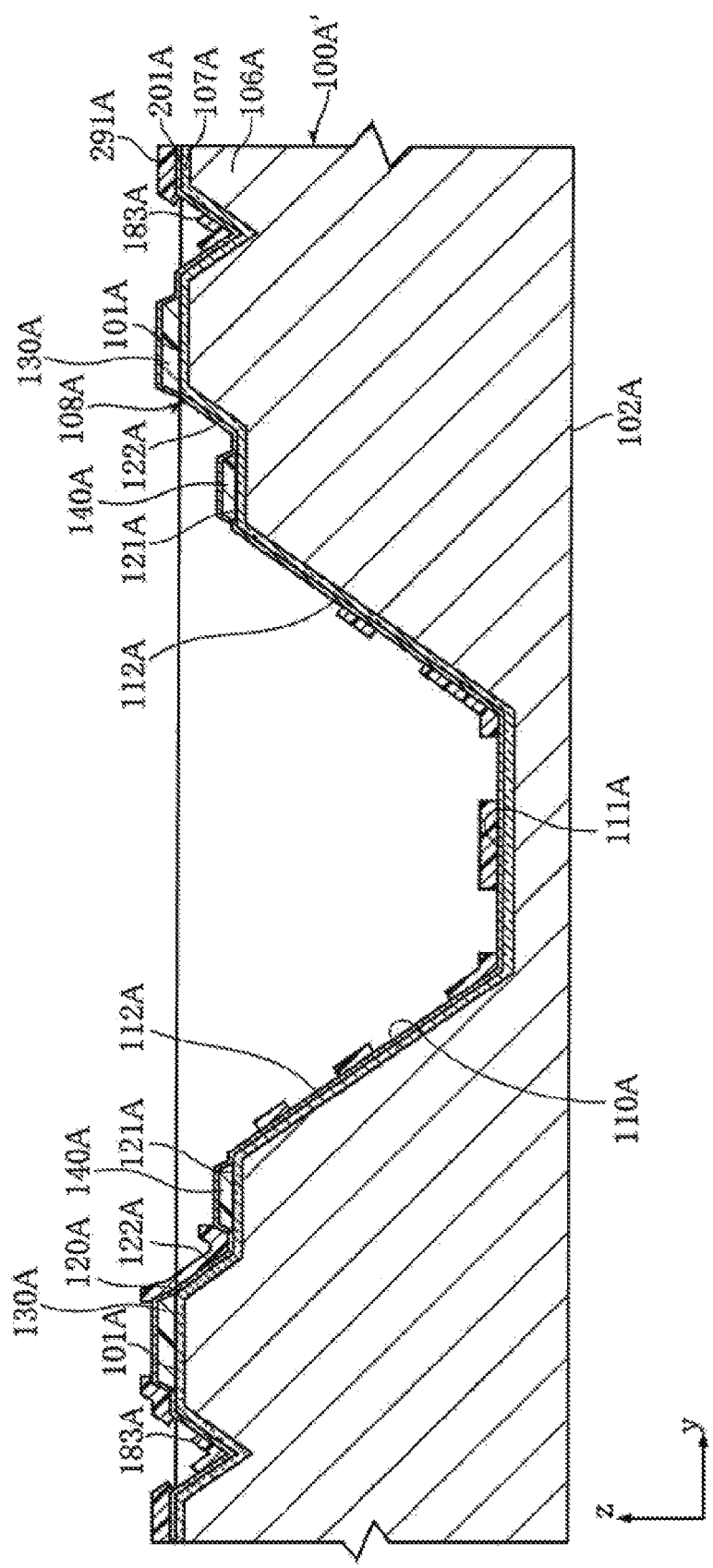
FIG. 17 is a cross-sectional view illustrating a main portion of the semiconductor device in FIG. 1 during the manufacturing process.

Next, as illustrated in FIG. 17, the photomask layer 291A is patterned. The patterning is achieved by, for example, performing the exposing and imaging procedures of photo lithography to the photomask layer 291A, in this way, the desired portions are removed. The shape of the photomask layer 291A obtained from this patterning process corresponds to the shapes of the wiring layer 200A and metal film 500A. Further, since the recess 108A has a certain level of depth, it is also feasible to change the focus depth of the exposure and performing multiple exposures at the same time.

Figure 18:
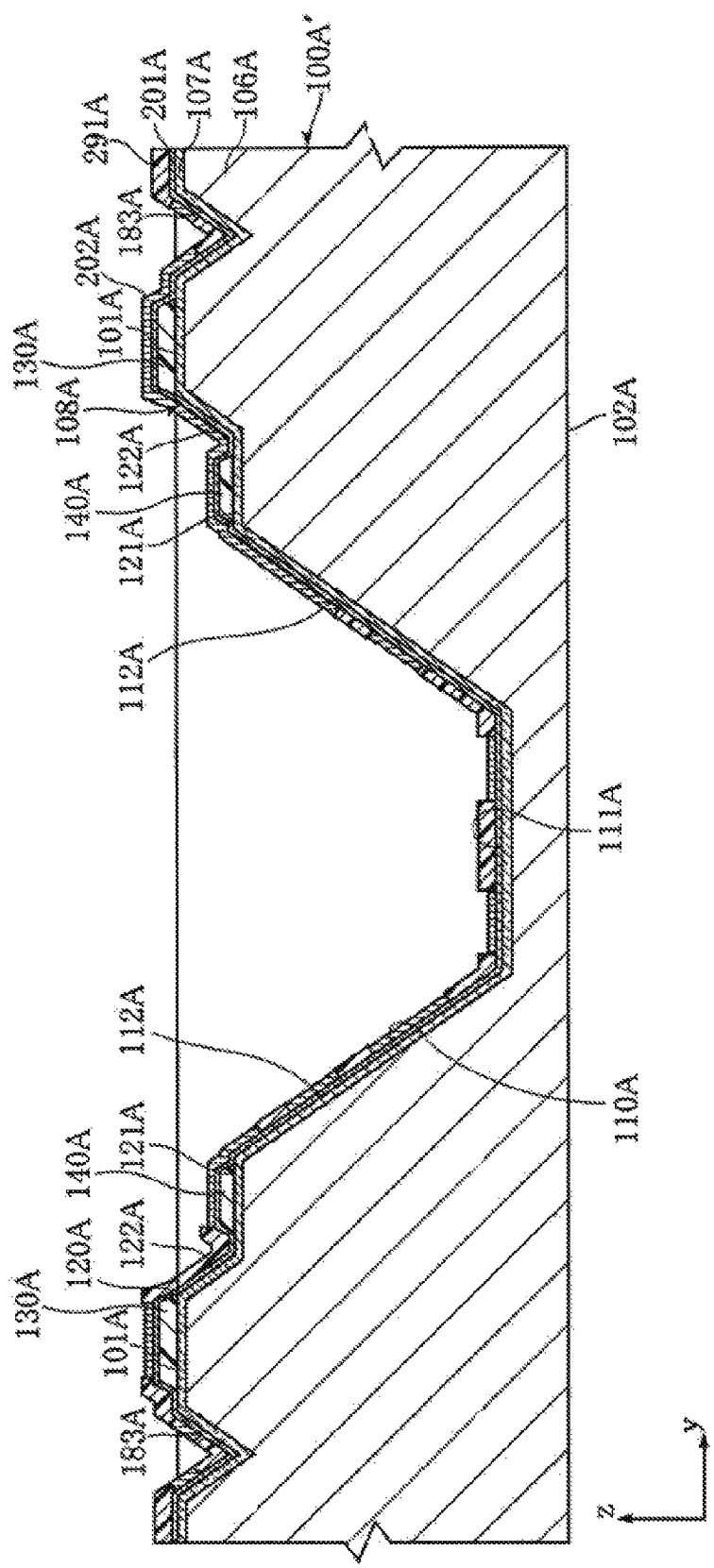
FIG. 18 is a cross-sectional view illustrating a main portion of the semiconductor device in FIG. 1 during the manufacturing process.

Subsequently, as illustrated in FIG. 18, the plating layer 202A is formed. The formation of the plating layer 202A is accomplished by, for example, electroplating the seed layer of the barrier/seed layer 201A. As a consequence, the plating layer 202A comprising, such as, Cu is obtained. The thickness of the plating layer 202A is, for example, about 5 μm. The plating layer 202A is shaped to have the same shape of the wiring layer 200A and the metal film 500A.

Figure 19:
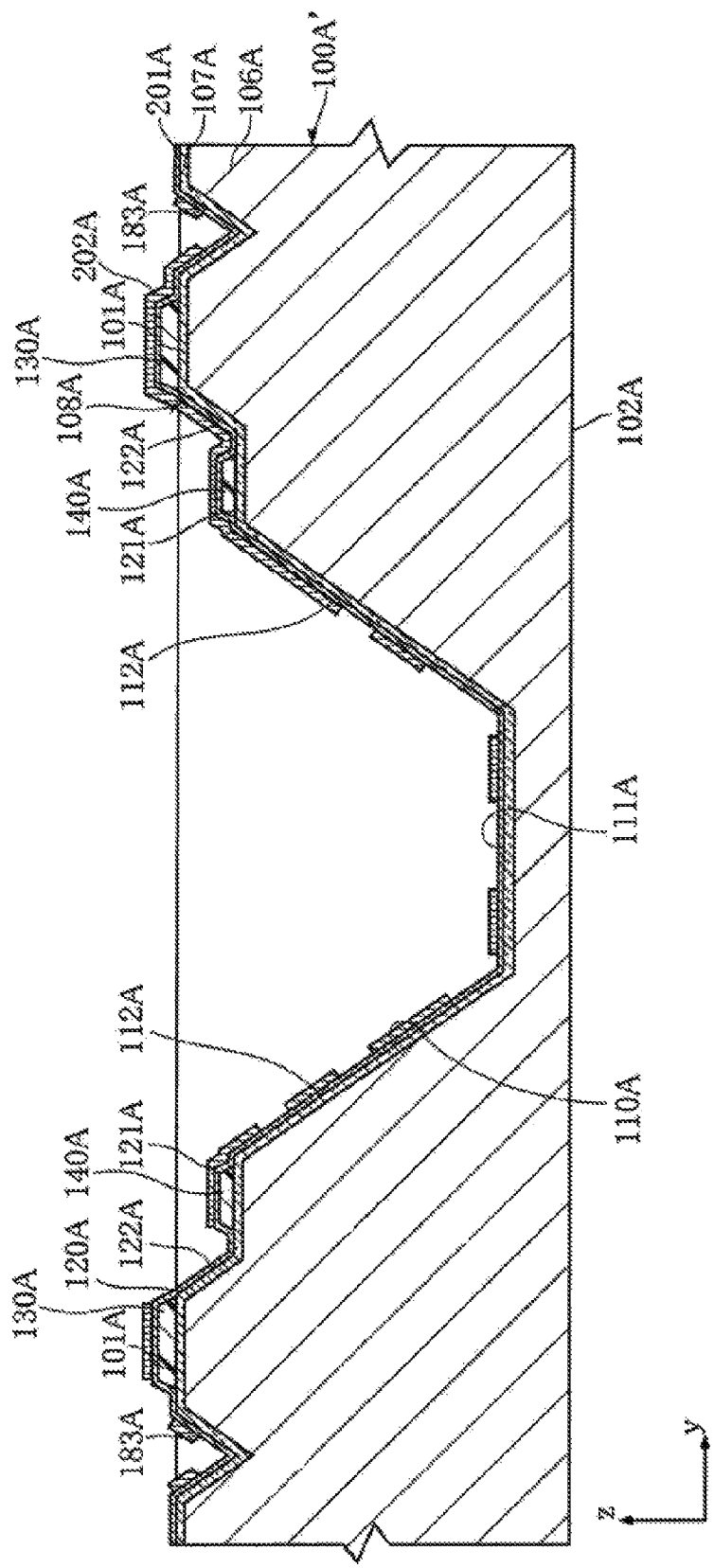
FIG. 19 is a cross-sectional view illustrating a main portion of the semiconductor device in FIG. 1 during the manufacturing process.
Figure 20:
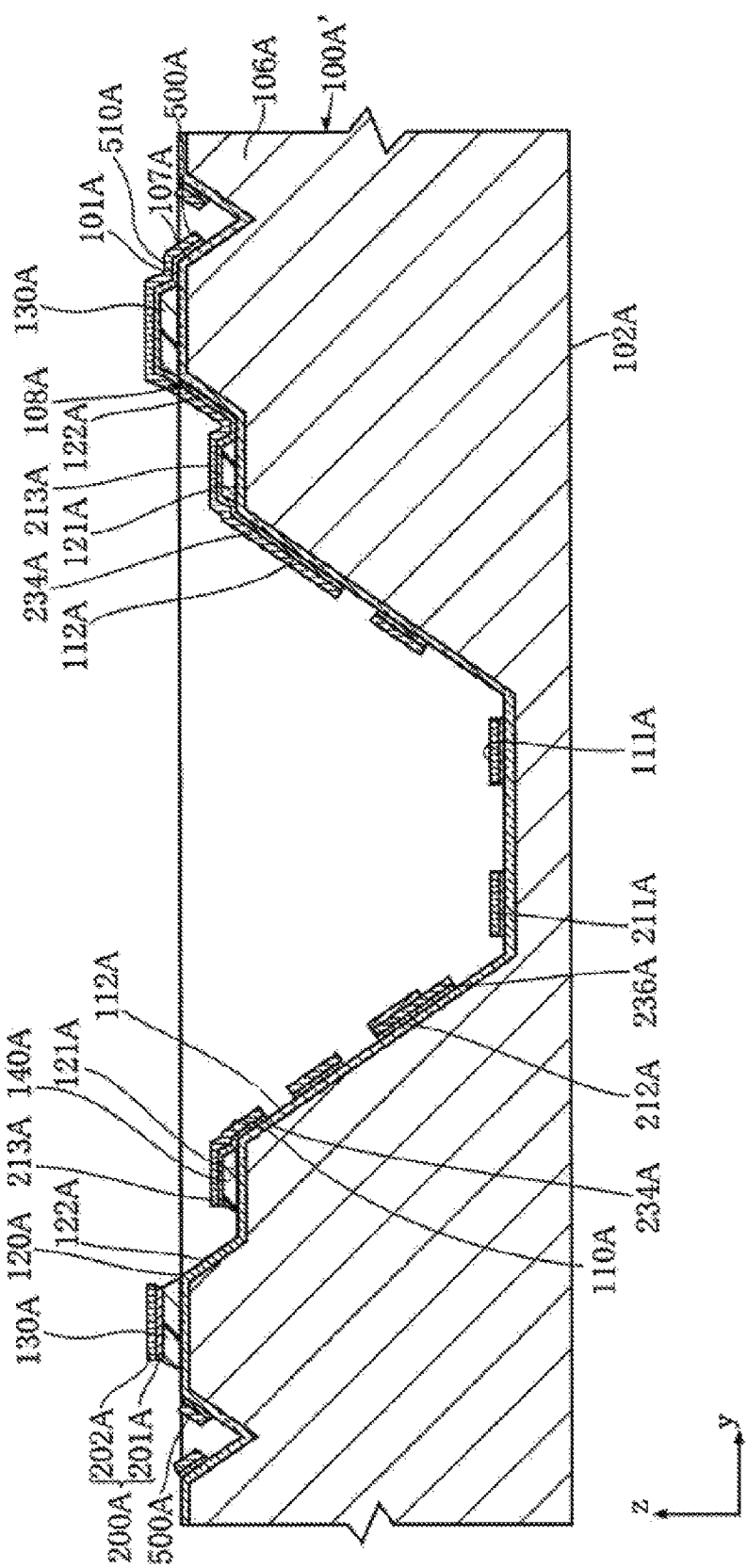
FIG. 20 is a cross-sectional view illustrating a main portion of the semiconductor device in FIG. 1 during the manufacturing process.

Then, as illustrated in FIG. 19, the photomask layer 291A is removed. Afterwards, as illustrated in FIG. 20, the portion of the barrier/seed layer 201A that is exposed through the plating layer 202A is removed. The removal of the barrier/seed layer 201A is carried out by, for example, wet etching. In this way, the barrier/seed layer 201A and the wiring layer 200A of the plating layer 202A that are both patterned are obtained. Also, in the present embodiment, while forming the wiring layer 200A, the metal film 500A comprising the barrier/seed layer 201A and the plating layer 202A is obtained at the same time.

Figure 21:
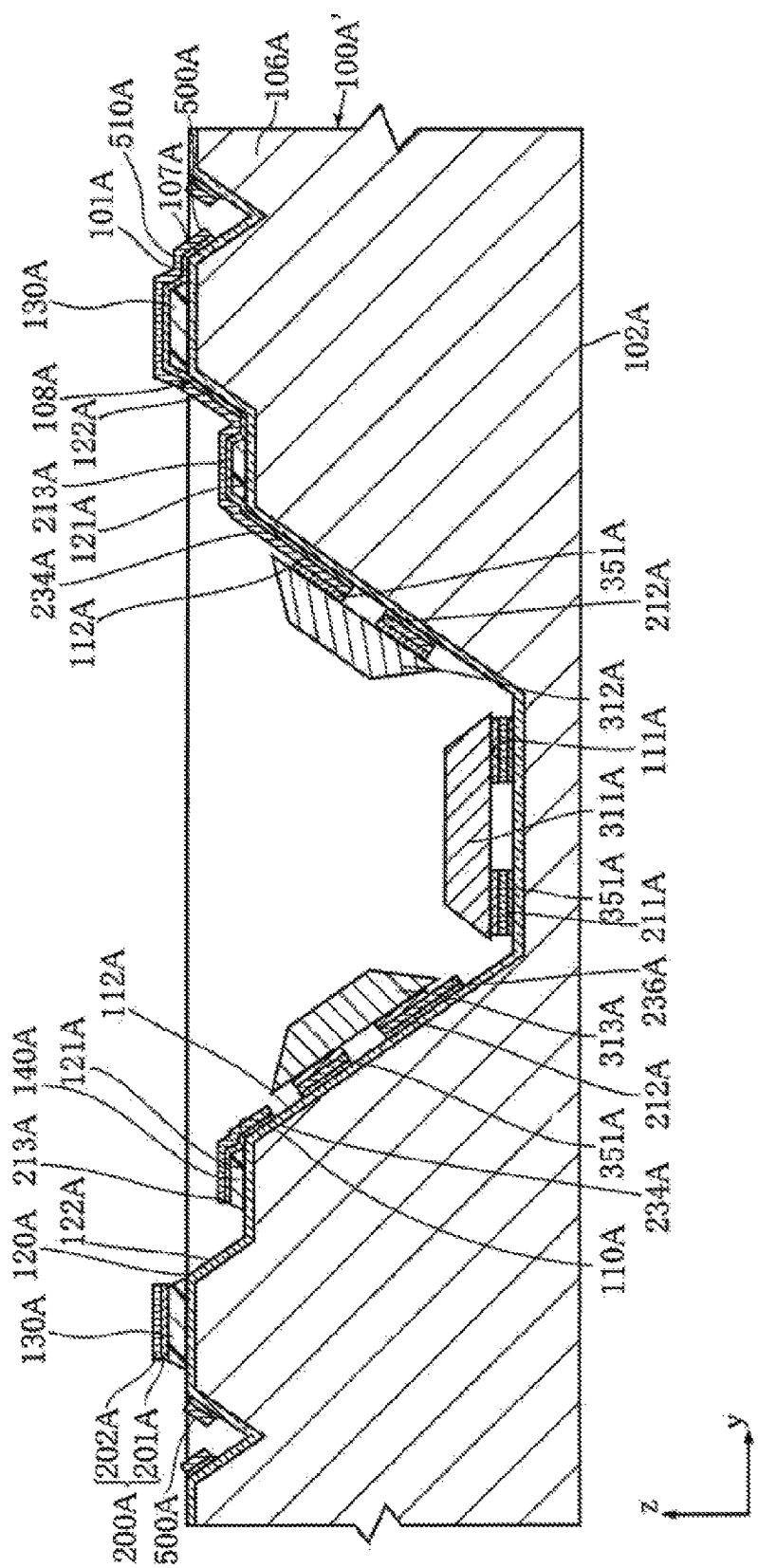
FIG. 21 is a cross-sectional view illustrating a main portion of the semiconductor device in FIG. 1 during the manufacturing process.

Next, as illustrated in FIG. 21, the orientation sensor elements 311A, 312A and 313A are loaded. In the orientation sensor elements 311A, 312A and 313A, soldering balls for use as the solders 351A are pre-formed. Also, soldering flux is pre-coated onto these soldering balls. By using the adhesiveness of the soldering flux, the orientation sensor element 311A is loaded on the first bottom surface 111A, and the orientation sensor elements 312A and 313A are loaded on the first inclined inner lateral face 112A. Then, the reflow is used to melt the soldering balls followed by a hardening process; in this way, the loading of the orientation sensor elements 311A, 312A and 313A is accomplished. Also, on the first inclined inner lateral face 112A that is not loaded with the load orientation sensor elements 312A and 313A, two capacitors 343A are loaded.

Figure 22:
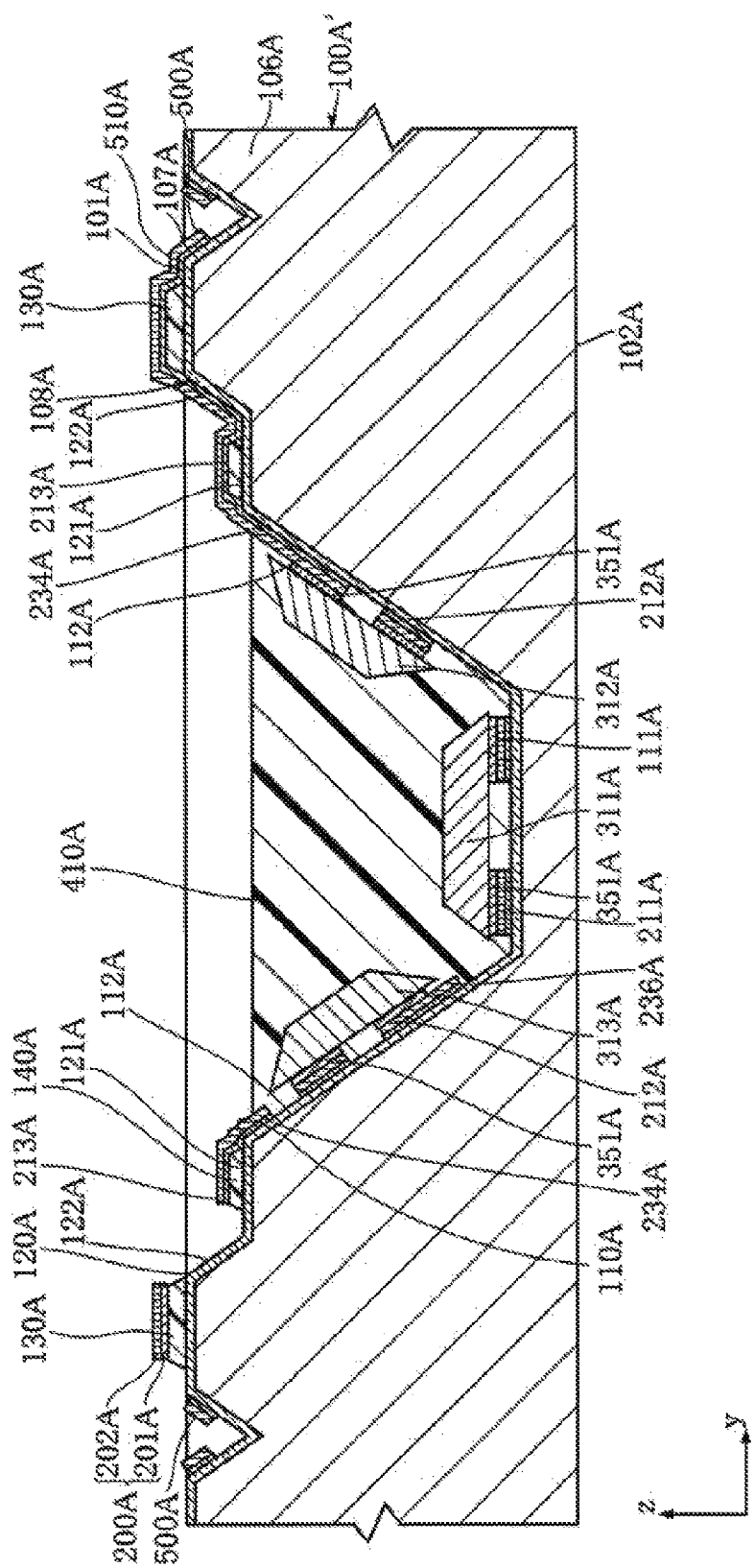
FIG. 22 is a cross-sectional view illustrating a main portion of the semiconductor device in FIG. 1 during the manufacturing process.

Subsequently, as illustrated in FIG. 22, the first sealing resin 410A is formed. The formation of the first sealing resin 410A is accomplished by, for example, filling, primarily in the first recess 110A, a resin material that has excellent permeability and can be hardened by light, and then hardening the resin material. At this time, the resin material is used to cover the entirety of the orientation sensor elements 311A, 312A and 313A. On the other hand, the resin forming portion pads 213A of the second bottom surface 121A are accurately exposed in advance. Further, illustrative examples of materials suitable for forming the first sealing resin 410A include, epoxy resins, phenolic resins, polyimide resins, polybenzoxazole (PBO) resin, and silicone resins. The first sealing resin 410A can be either transparent resins or opaque resins; however, in the present embodiment, the opaque resin is preferred.

Figure 23:
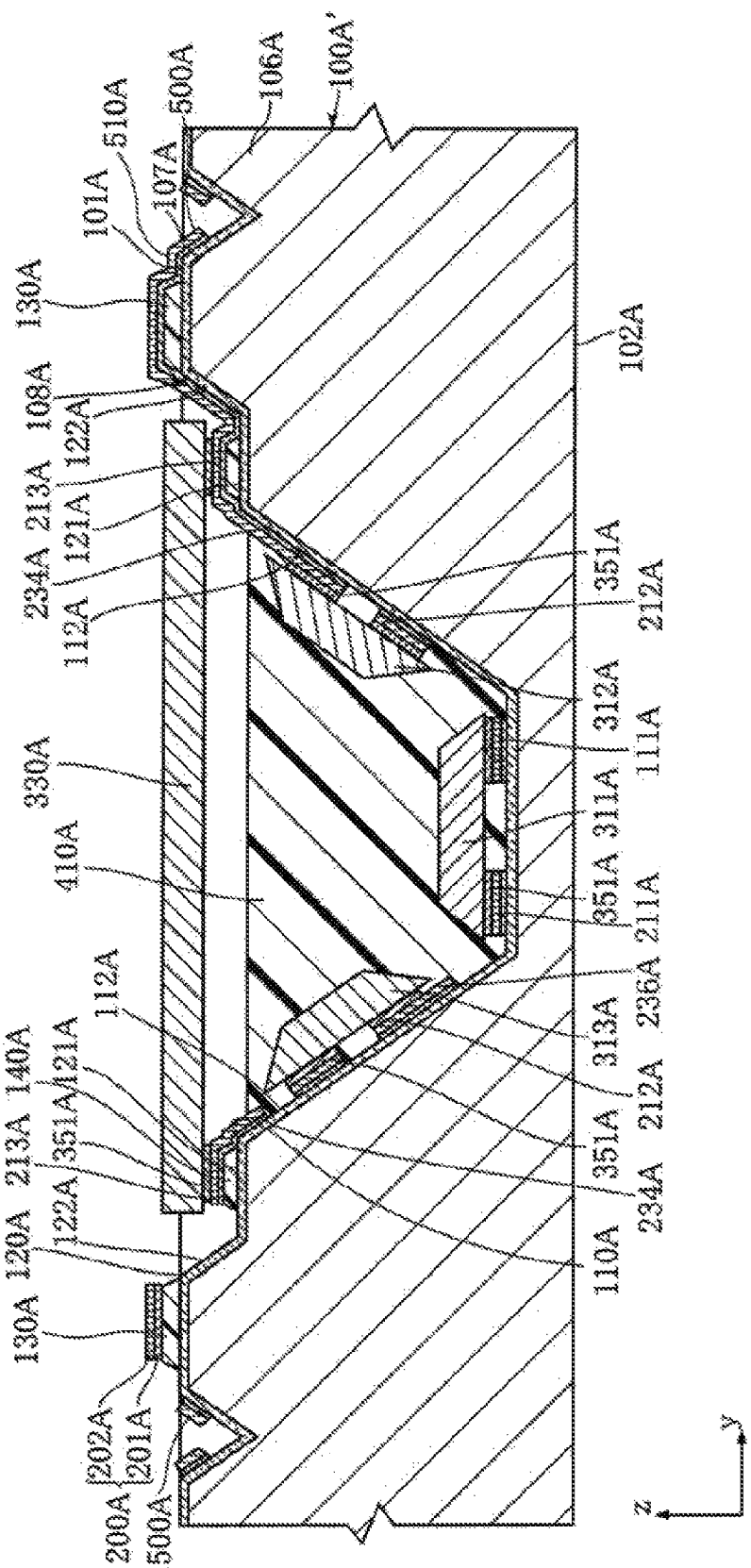
FIG. 23 is a cross-sectional view illustrating a main portion of the semiconductor device in FIG. 1 during the manufacturing process.

Thereafter, as illustrated in FIG. 23, the integrated circuit element 330A is loaded. Soldering balls for use as the solders 351A are pre-formed in the integrated circuit element 330A. Also, soldering flux is pre-coated onto these soldering balls. By utilizing the adhesiveness of the soldering flux, the integrated circuit element 330A is loaded on the resin forming portion 140A of the second bottom surface 121A. Then, the reflow is used to melt the soldering balls followed by the hardening process; in this way, the loading of the integrated circuit element 330A is accomplished.

Figure 24:
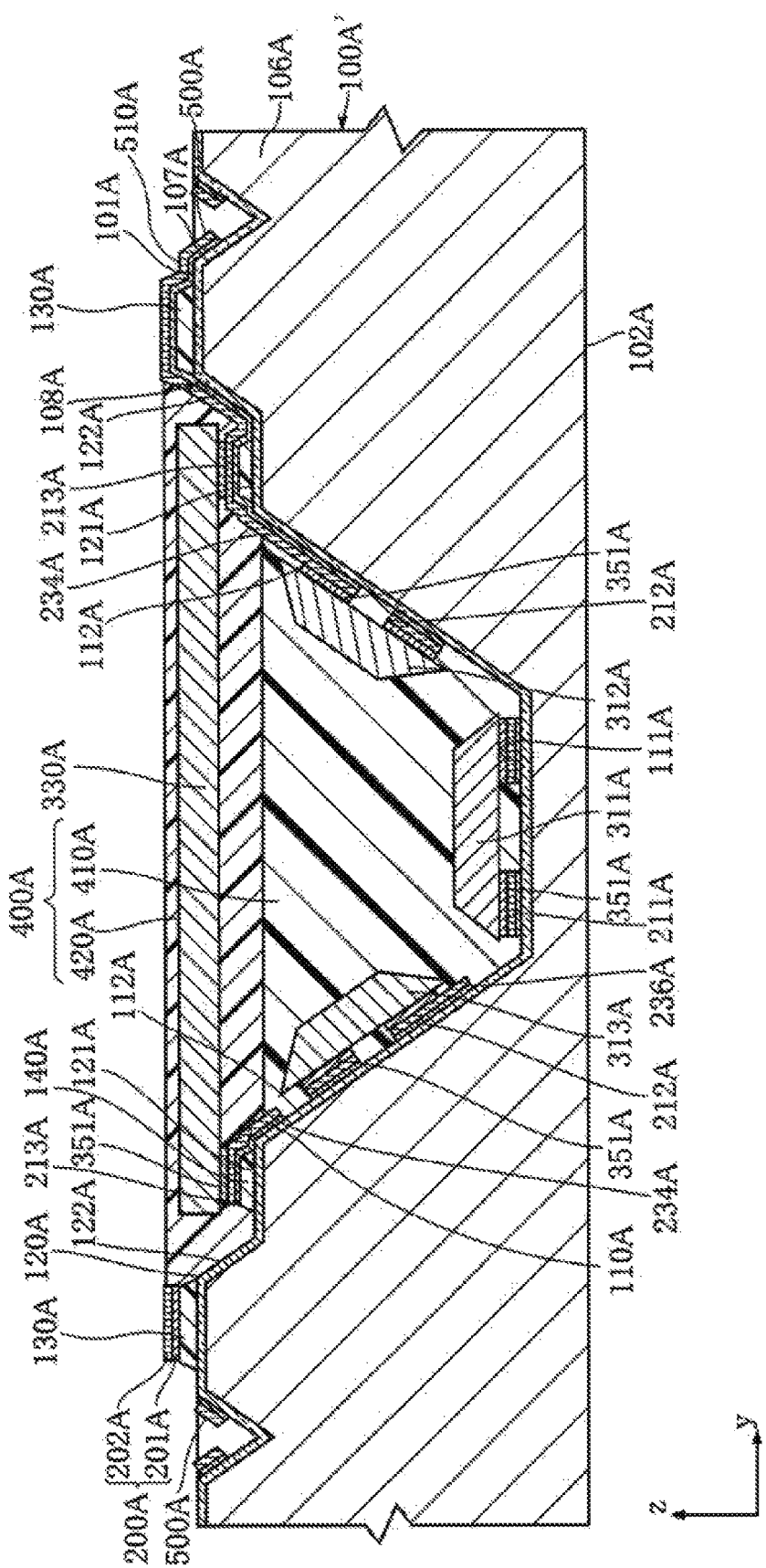
FIG. 24 is a cross-sectional view illustrating a main portion of the semiconductor device in FIG. 1 during the manufacturing process.

Next, as illustrated in FIG. 24, the second sealing resin 420A is formed. The formation of the second sealing resin 420A is accomplished by, for example, filling, primarily in the second recess 120A, a resin material that has excellent permeability and can be hardened by light, and then hardening the resin material. At this time, the resin material is used to cover the entirety of the integrated circuit element 330A. On the other hand, a portion of the plating layer 202A on the main surface 101A is accurately exposed in advance. Also, the second sealing resin 420A is formed in the following cutting region in a non-overlapping way. Further, illustrative examples of materials suitable for forming the second sealing resin 420A include, epoxy resins, phenolic resins, polyimide resins, polybenzoxazole (PBO) resin, and silicone resins. The second sealing resin 420A can be either transparent resins or opaque resins; however, in the present embodiment, the opaque resin is preferred.

Figure 25:
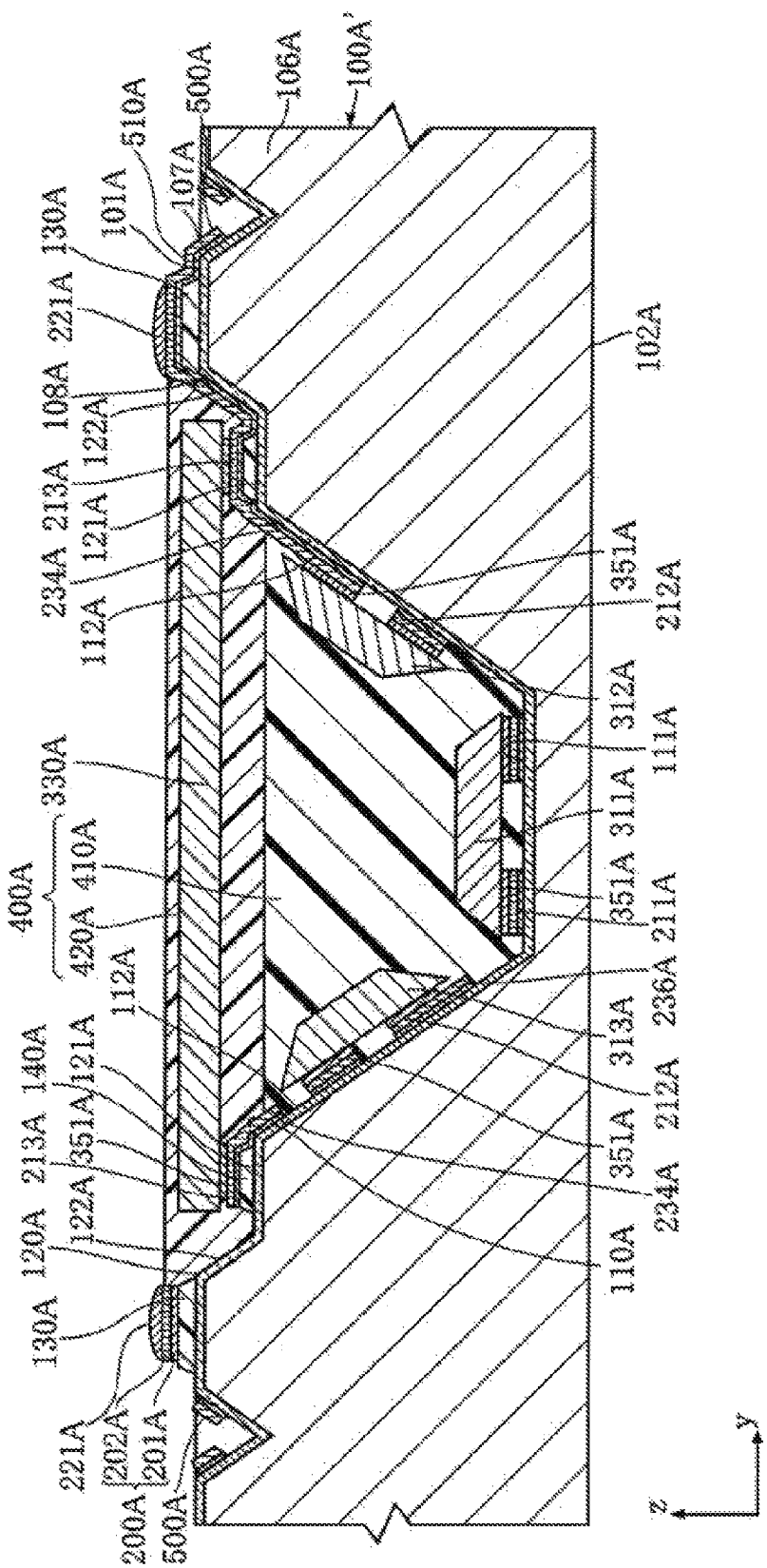
FIG. 25 is a cross-sectional view illustrating a main portion of the semiconductor device in FIG. 1 during the manufacturing process.

Subsequently, as illustrated in FIG. 25, a plurality of bumps protruding along the z direction are formed at the external terminals 221A by, for example, electroless plating of metals such as Ni, PD, Au, etc.

Figure 26:
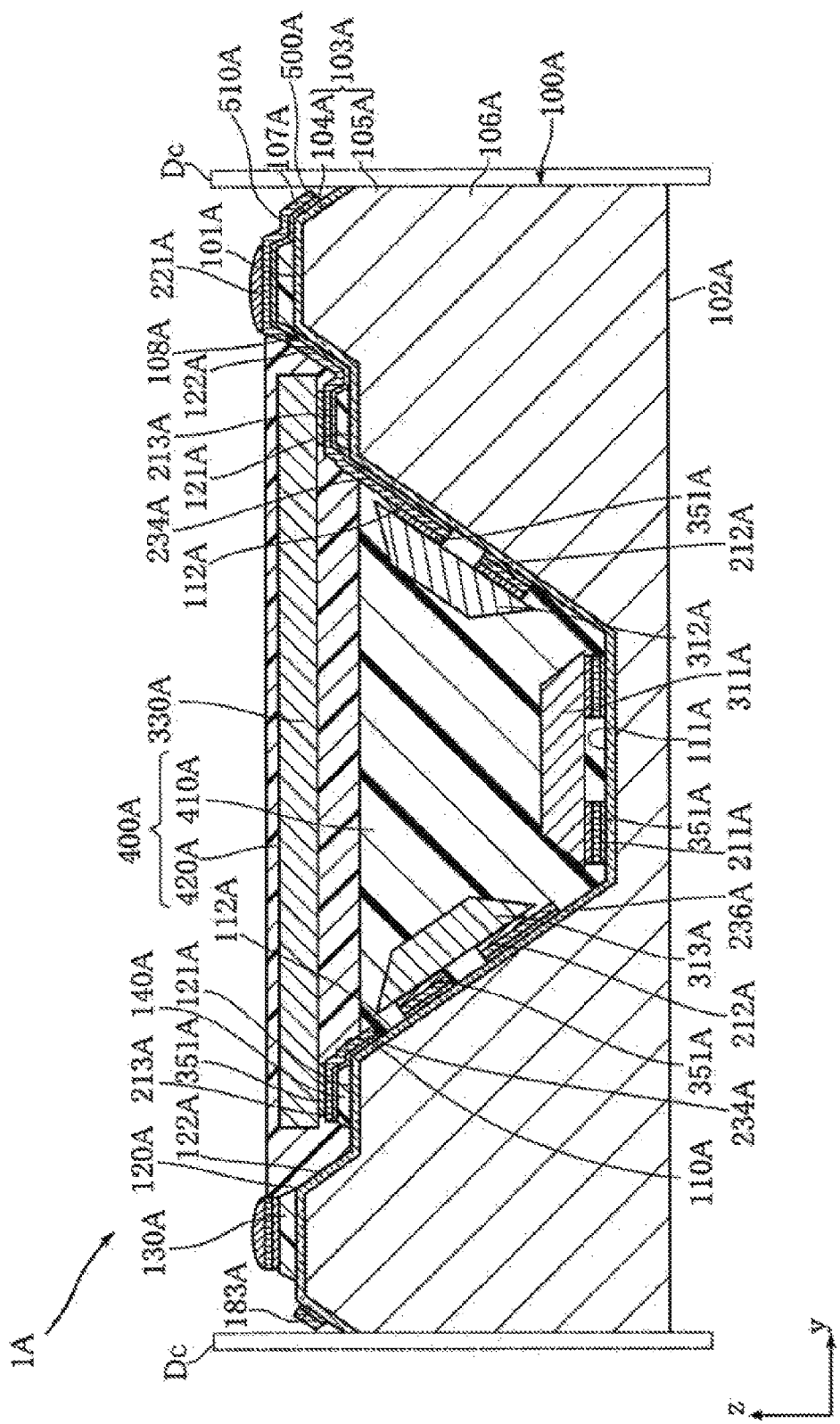
FIG. 26 is a cross-sectional view illustrating a main portion of the semiconductor device in FIG. 1 during the manufacturing process.
Figure 27:
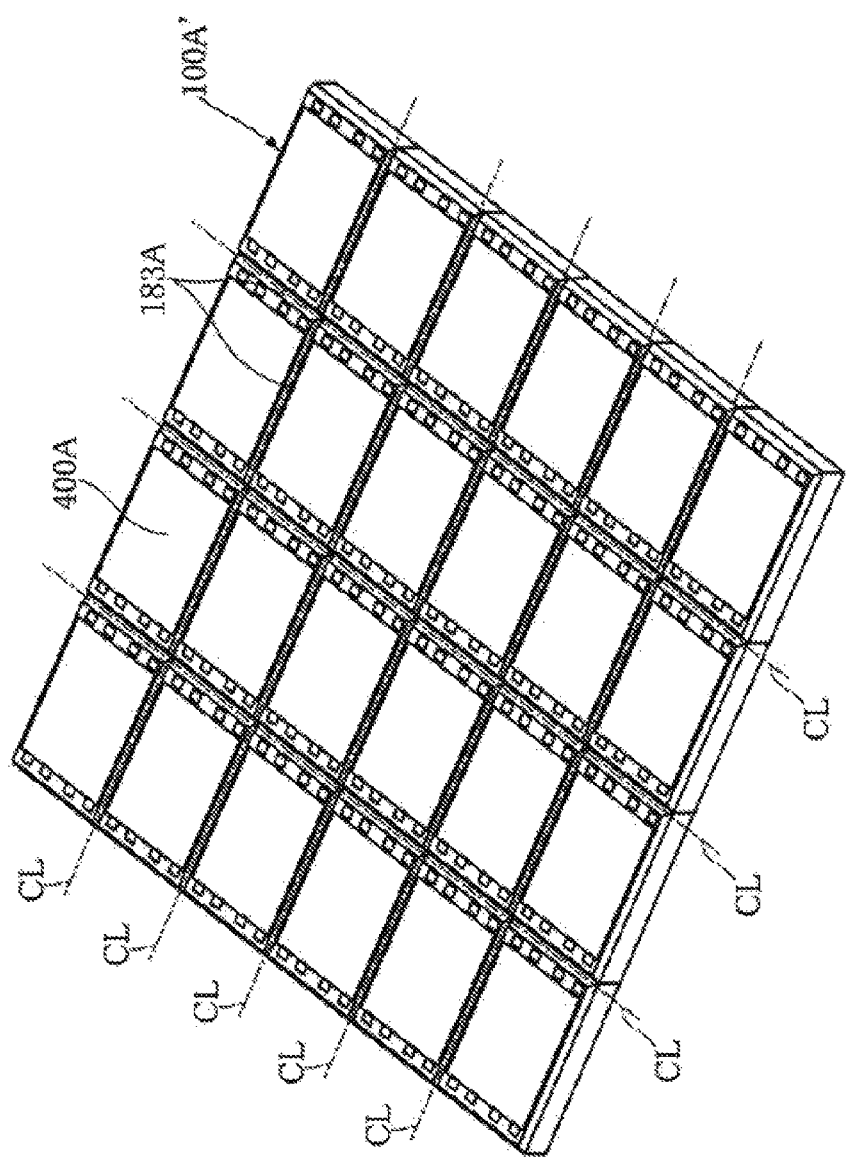
FIG. 27 is a stereogram illustrating a main portion of the semiconductor device in FIG. 1 during the manufacturing process.

Then, as illustrated in FIG. 26 and FIG. 27, the substrate material 100A' is cut using, for example, the cutting machine Dc. When viewing from the z direction, the cutting process carried out by the cutting machine Dc comprises cutting the cutting line CL of the inclined slot 183A. At this time, the cutting machine Dc is used to cut only the substrate material 100A', while, for example, the second sealing resin 420A is not cut. The semiconductor device 1A illustrated in FIG. 1 to FIG. 4 is obtained through this cutting process. Then, the face exposed due to the cutting becomes the vertical outer lateral face 105A. This vertical outer lateral face 105A formed by cutting has a relatively rougher surface. On the other hand, the inclined outer lateral face 104A of the inclined slot 183A, which is formed by anisotropic etching, is more even; hence, it is smoother than the vertical outer lateral face 105A.

The semiconductor device 1A and the effects of the manufacturing method for the semiconductor device 1A are discussed below.

According to the present embodiment, three orientation sensor elements 311A, 312A and 313A are accommodated in the first recess 110A of the recess 108A of the substrate 100A that comprises a semiconductor material. Therefore, there is no need to dispose wires for supporting said three orientation sensor elements 311A, 312A and 313A. As compared with the cases where the wires are formed by molding with dies, the cost associated with changing the shape of the substrate 100A is less. Accordingly, the cost of the semiconductor device 1A is reduced. In particular, the effect of reduced cost is more significant when the semiconductor devices 1A are produced in lesser amount.

During the manufacture of the semiconductor device 1A, if the substrate material 100A' is cut along the cutting line CL comprised in the inclined slot 183A formed on the main surface 101A, the outer lateral face 103 of the cut, crystallized substrate 100A comprises a portion for use as the region of the inclined slot 183A (i.e., the inclined outer lateral face 104A). During the manufacture of the semiconductor device 1A, the cutting process of the substrate material 100A' is performed at the same time with the guiding of the portion of the inclined slot 183A. In this way, when the substrate material 100A' is cut, it is feasible to inhibit the formation of defects such as cracking or to chipping in the substrate material 100A' or substrate 100A. Accordingly, the present method can be used to manufacture semiconductor device 1A with a better yield rate.

During the manufacture of the semiconductor device 1A, the inclined slot 183A and the recess 108A (the first recess 110A) are batch produced by anisotropic etching at the same time. Then, when the substrate material 100A' is cut, the cutting is carried out along the cutting line CL. Since the cutting line CL is comprised in the inclined slot 183A, the cutting depth of the substrate material 100A' is less than the thickness of the substrate material 100A'. In this way, it is feasible to cut the substrate material 100A' with a better efficiency.

Additionally, the vertical outer lateral face 105A constituting the outer lateral face 103A is a cutting surface formed by cutting of the substrate material 100A' at the site of the inclined slot 183A. That is, the inclined outer lateral face 104A formed by anisotropic etching is smother than the vertical outer lateral face 105A formed by cutting the substrate material 100A'.

For the substrate 100A that consists of monocrystalline comprising a semiconductor material such as silicon, the first inclined inner lateral face 112A and the second inclined inner lateral face 122A can be processed to form surfaces that are accurately inclined in relative to the first bottom surface 111A and the second bottom surface 121A at a specific predetermined angle. In particular, by using the substrate 100A comprising Si and using the surface (100) as the main surface 101A, the respective inclined angle between the four first inclined inner lateral faces 112A or the four second inclined inner lateral face 122A in relative to the first bottom surface 111A or the second bottom surface 121A is set as about 55°. In this way, it is feasible to obtain a semiconductor device 1A having a balanced shape.

The recess 108A is formed into a two-step shape using the first recess 110A and the second recess 120A, so that the first recess 110A is configured to accommodate the orientation sensor elements 311A, 312A and 313A and the two capacitors 343A.

The resin forming portions 130A and 140A are formed at the main surface 101A and the recess 108A. According to the configuration of the resin forming portions 130A and 140A, a step difference can be set at an appropriate portion of the main surface 101A and the recess 108A, thereby accurately forming the external terminals 221A or loading the integrated circuit element 330A. For example, as could be appreciated from FIG. 3 and FIG. 4, when the integrated circuit element 330A is loaded on the second bottom surface 121A without being separated by the resin forming portion 140A, the interference between the integrated circuit element 330A and the capacitors 343A may occur. In contrast, by forming the resin forming portion 140A on the second bottom surface 121A, it is feasible to load the integrated circuit element 330A at a location where the interference between the capacitors 343A and the main surface 101A can be avoided, without the need of changing the shape or location of the second bottom surface 121A. Also, as illustrated in FIG. 3, the integrated circuit element 330A protrudes above the main surface 101A. In contrast, by forming the external terminals 221A on the main surface 101A using the resin forming portion 130A for separation, these external terminals 221A can be surface mounted and protrude in the z direction.

Since the lateral surfaces 132A and 142A of the resin forming portions 130A and 140A are inclined, the connection paths of the wiring layer 200A formed on these lateral surfaces 132A and 142A can be configured to connect to the external terminals 221A and the resin forming portion pads 213A.

The metal film 500A is pre-formed at the inclined outer lateral face 104A, and during the installation of the semiconductor device 1A, the metal film 500A is connected to the ground via the connection paths 510A and the external terminals 221A. The metal film 500A having the above-mentioned configuration can be used to exhibit the electromagnetic shielding function that shields each element accommodated in the recess 108A from the electromagnetic wave from the outside. Also, when viewing from the z direction (i.e., from the normal direction of the main surface 101A), the metal film 500A, as a whole, surrounds the main surface 101A. According to such configuration of the metal film 500A, it is expected to enhance the electromagnetic shielding effect further.

Moreover, the area for forming the metal film 500A can be altered as desired. If it is desired to form the metal film 500A with an area greater than that illustrated in FIG. 2, it is feasible to increase the area of the inclined outer lateral face 104A, in relative to, such as, the present embodiment, to form a wider inclined outer lateral face 104A, and form the metal film 500A in said area which is wider in relative to the inclined outer lateral face 104A.

The metal film 500A and the wiring layer 200 are batch formed at the same time. Therefore, the metal film 500A is formed with a good efficiency. Also, the inclined outer lateral face 104A with the metal film 500A formed thereon is formed by anisotropic etching with, for example, KOH, thereby forming a smooth surface like the recess 108A. Accordingly, it is feasible to accurately form the metal film 500A on the smooth inclined outer lateral face 104A.

The integrated circuit element 330A is supported by the second bottom surface 121A, and when viewing from the plan view, superimposes over a portion of the first recess 110A, so that the orientation sensor elements 311A, 312A and 313A and the two capacitors 343A and the integrated circuit element 330A are sterically disposed in the z direction. In this way, the miniaturization and high functionality of the semiconductor device 1A can be accomplished.

Since the wiring layer 200A comprises connection paths 231A, 234A, 235A and 236A, the external terminals 221A, the resin forming portion pads 213A, the first bottom surface pads 211A and the first inclined inner lateral face pads 212A can connect with one another accurately as desired. Since the connection paths 231A passes through the second inclined inner lateral face 122A, it can accurately conduct the external terminals 221A and the resin forming portion pads 213A that are sterically formed on the substrate 100A, thereby reducing the possibility of the broken wire. Also, since the connection paths 234A, 235A and 236A pass through the first inclined inner lateral face 112A, the possibility of the broken wire is reduced.

Because the three orientation sensor elements 311A, 312A and 313A and the two capacitors 343A are covered by the sealing resin 400A, it is feasible to accurately protect said orientation sensor elements 311A, 312A and 313A and two capacitors 343A. By configuring the sealing resin 400A to have a configuration comprising the first sealing resin 410A and the second sealing resin 420A, it is feasible to accurately fill the two-stepped recess 108A comprising the first recess 110A and the second recess 120A.

By configuring the first sealing resin 410A to have a configuration that is primarily filled in the first recess 110A, it is feasible to accurately cover the three orientation sensor elements 311A, 312A and 313A and two capacitors 343A before loading the integrated circuit element 330A. Also, by using the second sealing resin 420A to cover the integrated circuit element 330A, it is feasible to form the sealing resin 400A between the integrated circuit element 330A and said three orientation sensor elements 311A, 312A and 313A and two capacitors 343A without the formation of accidental gaps. The external terminals 221A is exposed through the second sealing resin 420A, so that the semiconductor device 1A can be surface mounted easily, and hence it is feasible to accurately inhibit the incorrect conduction between, for example, the circuit substrate and integrated circuit element 330A or said three orientation sensor elements 311A, 312A and 313A and two capacitors 343A of assembled semiconductor device 1A.

Further, during the manufacture of the semiconductor device 1A, methods suitable for cutting the substrate material 100A' include, in addition to the cutting machine Dc described regarding FIG. 26, methods such as plasma cutting or deep etching such as the BOSCH method.

Figure 28:
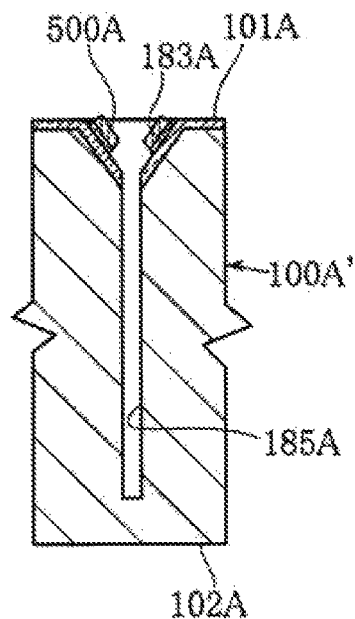
FIG. 28 is a cross-sectional view illustrating a main portion of the semiconductor device in FIG. 1, according to an embodiment different from that in FIG. 26.
Figure 29:
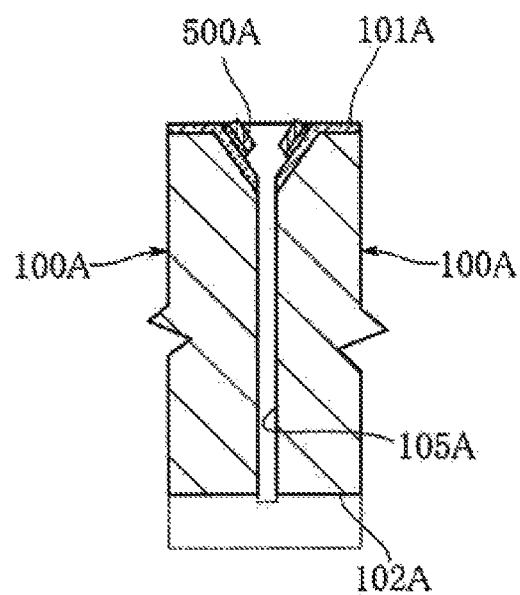
FIG. 29 is a cross-sectional view illustrating the step following the step in FIG. 28.

When using the deep etching method to cut the substrate material 100A', a first step is performed to, for example, etch the substrate material 100A' to a certain depth, and a second step is performed to grind the back surface side of the substrate material so as to cut the substrate material 100A'. In this case, during the first step, as illustrated in FIG. 28, the deep etching is carried out from the location where the inclined slot 183A is formed along the depth direction until it reaches a specific depth, to form a vertical slot 185. Subsequently, the main surface 101A side of the substrate material 100A' is supported by a supporting material such as a tape (not illustrated). Then, as illustrated in FIG. 29, the substrate material 100A' is ground from the side of the back surface 102A until the region where the vertical slot 185A is formed is reached. In this way, the substrate material 100A' is cut into a plurality of substrates 100A, and hence, the region where the vertical slot 185 is formed becomes the vertical outer lateral face 105A.

Figure 30:
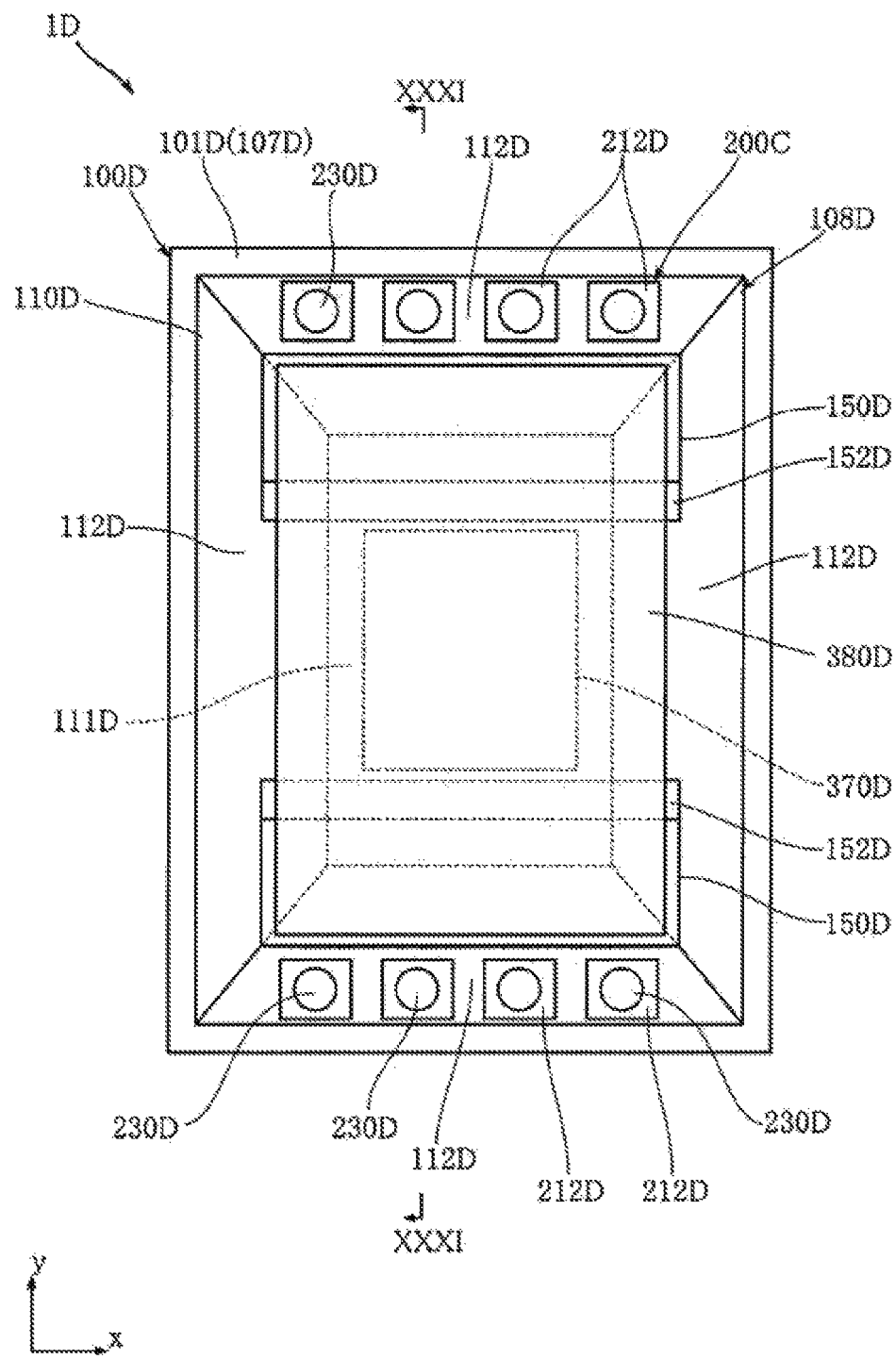
FIG. 30 is a top view a main portion of the semiconductor device according to the second embodiment of the present invention.
Figure 31:
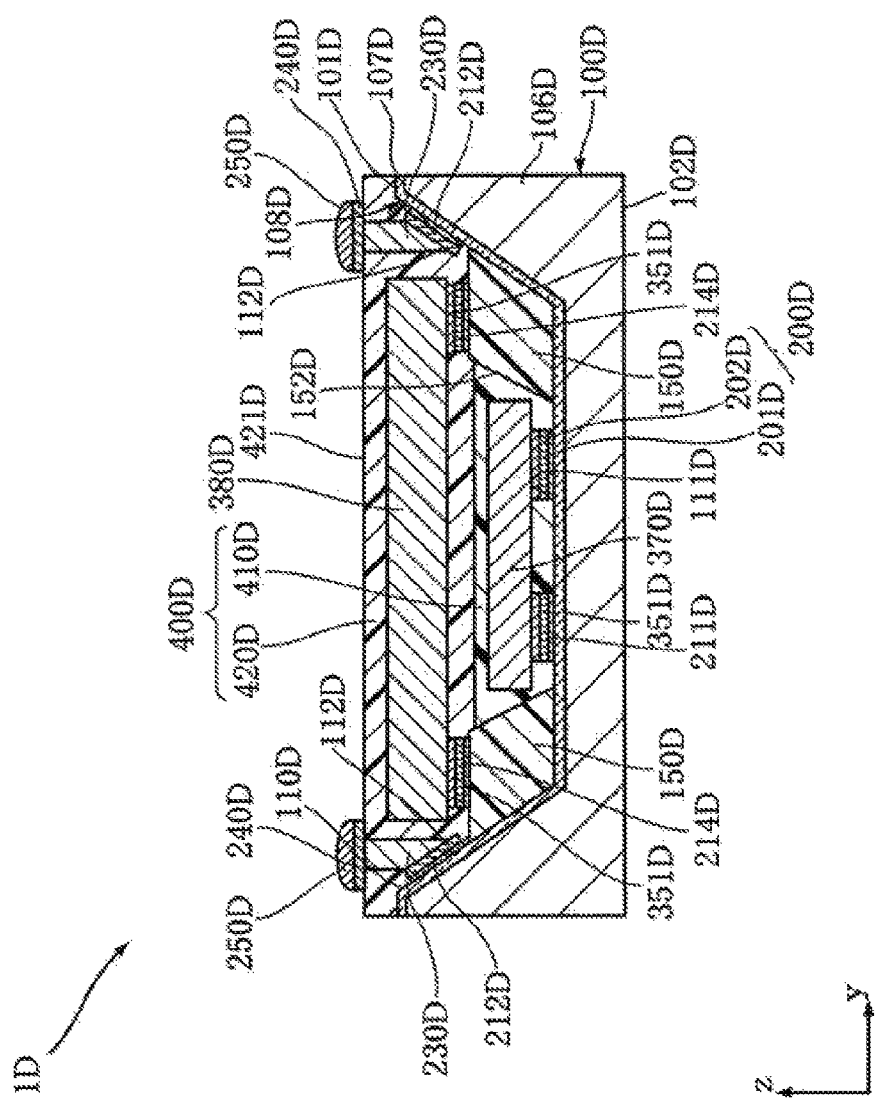
FIG. 31 is a cross-sectional view taken along the line XXXI-XXXI in FIG. 30.

FIG. 30 and FIG. 31 illustrate a semiconductor device according to the second embodiment of the present invention. The semiconductor device according to the present embodiment comprises a substrate 100D, a resin forming portion 150D, a wiring layer 200D, a columnar conductive portion 230D, a first element 370D, a second element 380D, and a sealing resin 400D. Further, in FIG. 30, the sealing resin 400 D is omitted to facilitate the understanding of the drawing. Also, in FIG. 30 and FIG. 31, the connection paths are omitted.

The substrate 100D is the base for the semiconductor device 1D and comprises a base material 106D and an insulating layer 107D. The substrate 100D comprises a main surface 101D, a back surface 102D, and a recess 108D. The depth of the substrate 100D is, for example, about 600 μm. Further, in the present embodiment, the main surface 101D and the back surface 102D face the opposite sides in the z direction, and the z direction is equivalent to the depth direction of the semiconductor device 1D. Also, both the x direction and the y direction are perpendicular to the z direction.

The base material 106D is a monocrystalline base comprising the semiconductor material, and in the present embodiment, the monocrystalline silicon. Also, the insulating layer 107D according to the present embodiment comprises $SiO_2$. Further, the material suitable for use as the base material 106D is not limited to Si; rather, it could be any material suitable for forming the recess 108D as described below. The insulating layer 107D covers the portion of the base material 106D that is faced by the opposite side of the back surface 102D. The depth of the insulating layer 107D is, for example, about 0.1 to 1.0 μm.

In the present embodiment, the surface (100) of the base material 106D is used as the main surface 101D. The recess 108D is depressed from the main surface 101D toward the back surface 102D. In the present embodiment, the recess 108D comprises a first recess 110D. The first recess 110D comprises a first bottom surface 111D and four first inclined inner lateral faces 112D. The shape of the first recess 110D is dependent on the surface (100) for use as the main surface 101D.

Due to the formation of the recess 108D, the main surface 101D, when viewing from the top, has the shape of a rectangular ring. The first recess 110D has a rectangular shape in the plan view. The depth of the first recess 110D is, for example, about 440 μm. The first bottom surface 111D has a rectangular shape in the plan view. The four first inclined inner lateral faces 112D surround the first bottom surface 111D in the plan view, and the portion at which they are connected with the first bottom surface 111D is substantially configured in a trapezoid shape. Each first inclined inner lateral face 112D is inclined in relative to the first bottom surface 111D. In the present embodiment, the first inclined inner lateral face 112D is inclined in relative to the xy plane with an inclined angle of about 55°. Further, the first inclined inner lateral face 112D is substantially in a trapezoid shape and the inclined angle of about 55° is dependent on the surface (100) that is used as the main surface 101D.

The resin forming portion 150D is configured to form the step differences on the substrate 100D, and is formed on the substrate 100D (insulating layer 107D). In the present embodiment, the resin forming portion 150D is formed at the bottom surface (the first bottom surface 111D) of the recess 108D (the first recess 110D), and at the portion configured to load the second element 380D. In the present embodiment, the resin forming portion 150D is formed at the two portions of the first bottom surface 111D that are separated in the y direction. The height of the resin forming portion 150D is, for example, about 150 μm. The resin forming portion 150D comprises a flat top surface, and a lateral surface 152D that is inclined in relative to the top surface. Illustrative examples of materials suitable for forming the resin forming portions 150D include, for example, epoxy resins, phenolic resins, polyimide resins, polybenzoxazole (PBO) resins, and silicone resins. The resin forming portion 150D can be either transparent resins or opaque resins; however, in the present embodiment, the opaque resin is preferred.

The wiring layer 200D is configured to form the current path for inputting and outputting current to/from the first element 370D and the second element 380D. The wiring layer 200D is primarily formed on the insulating layer 107D, and in the present embodiment, it is a multilayered structure comprising a barrier/seed layer 201D and a plating layer 202D.

The barrier/seed layer 201D is configured to form a so-called basal layer for forming the desired plating layer 202D, and is primarily formed on the insulating layer 107D. The barrier/seed layer 201D comprises a Ti layer (e.g., for use as the barrier layer) formed on the insulating layer 107D and a Cu layer (e.g., for use as the seed layer) stacked on the barrier layer. The barrier/seed layer 201D is formed, for example, by sputtering. In the present embodiment, the barrier/seed layer 201D is formed on the insulating layer 107D and on specific portions of the resin forming portion 150D.

The plating layer 202D comprises, for example, Cu, and is formed by electroplating with the barrier/seed layer 201D. The thickness of the plating layer 202D is, for example, about 5 μm.

In the present embodiment, the wiring layer 200D comprises the first bottom surface pads 211D, the resin forming portion pads 214D, the first inclined inner lateral face pads 212D and connection paths (not shown in the drawing) for interconnecting said elements.

The first bottom surface pad 211D is formed at the first bottom surface 111D of the first recess 110D. In the present embodiment, a plurality of first bottom surface pads 211D are formed, and these first bottom surface pads 211D are configured to carry the first element 370D.

The resin forming portion pad 214D is formed at the resin forming portion 150A. In the present embodiment, a plurality of resin forming portion pads 214D are formed on each of the resin forming portions 150D that are separately disposed on the first bottom surface 111D. These resin forming portion pads 214D are configured to carry the second element 380D. Also, since the lateral surface 152D of the resin forming portion 150D is inclined, it can be configured to be formed at the connection paths (not shown) of the wiring layer 200D on the lateral surface 152D and connected with the resin forming portion pads 214D.

The first inclined inner lateral face pad 212D is formed at the first inclined inner lateral face 112D of the first recess 110D. In the present embodiment, a plurality of first inclined inner lateral faces pads 212D are formed on each of the two first inclined inner lateral faces 112D that are disposed separately by the first bottom surface 111D in the y direction. The first inclined inner lateral face pads 212D are connected with a portion of one end of the columnar conductive portion 230D.

External terminals 250D are disposed on the sealing resin 400D. The external terminals 250D are configured to surface mount the semiconductor device 1D on a circuit substrate of an electronic apparatus that is not illustrated in the drawings. In the present embodiment, the external terminals 250D are disposed in the sealing resin 400D (the second sealing resin 420D described below) at the upper surface 421D that faces the outer side of the main surface 101D in the normal direction. In the present embodiment, a plurality of external terminals 250D are respectively formed at two portions that are separated by the recess 108D in the y direction. The external terminals 250D are formed on the pads for the external terminals 240D described below, thereby forming a bump structure, which is formed, for example, by electroless plating of metals such as, Ni, Pd, Au, etc. In this way, the external terminal 250D has a shape that protrudes in the z direction. Further, in the present embodiment, at least one of the external terminals 250D is set as the so-called ground terminal.

The first element 370D is supported by the first bottom surface 111D, and is loaded using the solder 351D for the separating first bottom surface pads 211D.

The second element 380D is support at the resin forming portion 150D, and is loaded using the solder 351D for separating the plurality of resin forming portion pads 214D. In the present embodiment, the second element 380D is configured as a so-called Application Specific Integrated Circuit (ASIC) element, and has a thickness of about 80 to 100 μm.

The sealing resin 400D covers the first element 370D and the second element 380D, and is filled in the recess 108D (the first recess 110D). In the present embodiment, the sealing resin 400D comprises the first sealing resin 410D and the second sealing resin 420D.

The first sealing resin 410D covers the entirety of the first element 370D. On the other hand, the first sealing resin 410D does not cover the first inclined inner lateral face pads 212D and the second element 380D.

The second sealing resin 420D covers the entirety of the second element 380D. The second sealing resin 420D comprises an upper surface 421D. The upper surface 421D faces the outer side of the main surface 101D in the normal direction. The second sealing resin 420D covers a portion of the main surface 101D. On the other hand, the second sealing resin 420D allows the external terminals 250D to be exposed.

Illustrative examples of materials suitable for forming said first sealing resin 410D and second sealing resin 420D include, for example, epoxy resins, phenolic resins, polyimide resins, polybenzoxazole (PBO) resins, and silicone resins. The first sealing resin 410D and second sealing resin 420D can be either transparent resins or opaque resins; however, in the present embodiment, the opaque resin is preferred The columnar conductive portion 230D, as illustrated in FIG. 31, penetrates through the sealing resin 400D (the second sealing resin 420D) in the depth direction of the recess 108D. The columnar conductive portion 230D is connected to the portion of the wiring layer 200D that is formed in the recess 108D, and extends along the z direction (the normal direction of the main surface 101D). In the present embodiment, the lower end of the columnar conductive portion 230D in the drawing is connected with the first inclined inner lateral face pads 212D formed at the first inclined inner lateral face 112D. The columnar conductive portion 230D comprises, for example, Cu, and is formed by electroplating with the first inclined inner lateral face pads 212D. In the present embodiment, a plurality of columnar conductive portions 230D extend from two first inclined inner lateral faces 112D that are separated by the bottom surface 111D in the y direction. The upper end of the columnar conductive portion 230D in the drawing and the upper surface 421D of the second sealing resin 420D are co-planar.

The pads for the external terminals 240D are formed on the sealing resin 400D. The pads for the external terminals 240D are formed on the upper surface 421D of the second sealing resin 420D. In the present embodiment, the pads for the external terminals 240D comprise, for example, Cu, and each of the plurality of the pads for the external terminals 240D is disposed correspondingly to each of the plurality of columnar conductive portions 230D. When viewing from the z direction, the pads for the external terminals 240D and the external terminals 250D formed on the pads for the external terminals 240D superimpose over the columnar conductive portion 230D. The pads for the external terminals 240D covers the upper end of the columnar conductive portion 230D, and is connected with the upper end of the columnar conductive portions 230D.

Next, the order in which the columnar conductive portions 230D penetrating through the sealing resin 400D (the second sealing resin 420D) are formed is discussed below by referencing to FIG. 32 to FIG. 39.

Figure 32:
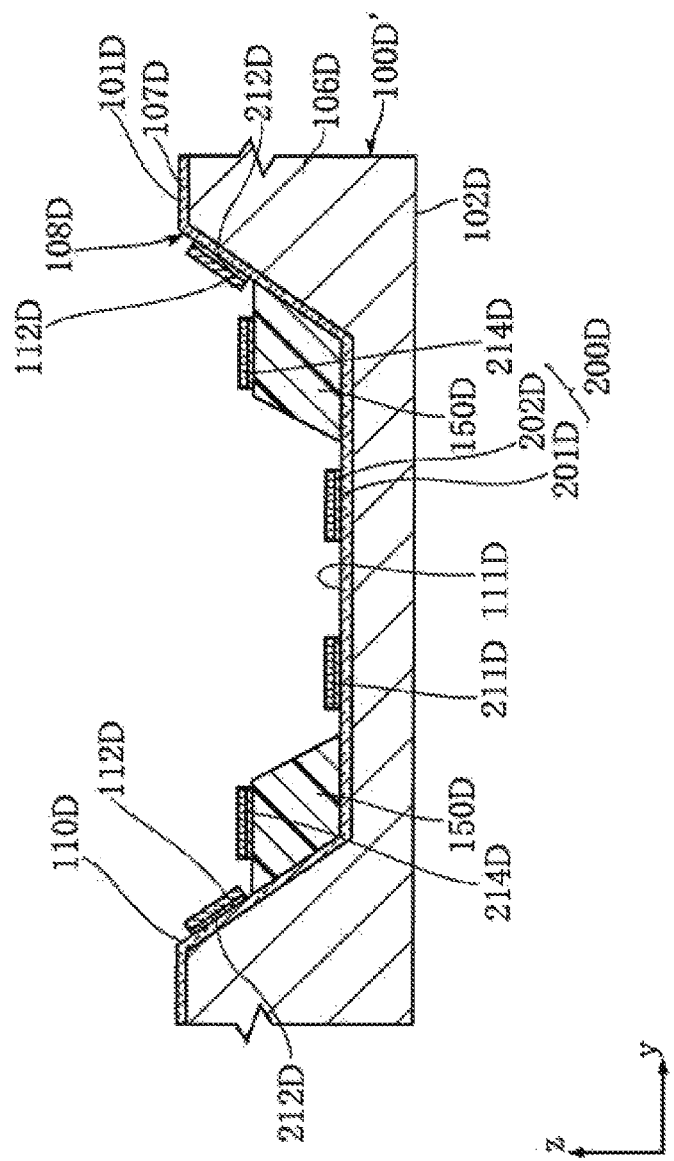
FIG. 32 is a cross-sectional view illustrating the order in which the columnar conductive portion is formed.
Figure 33:
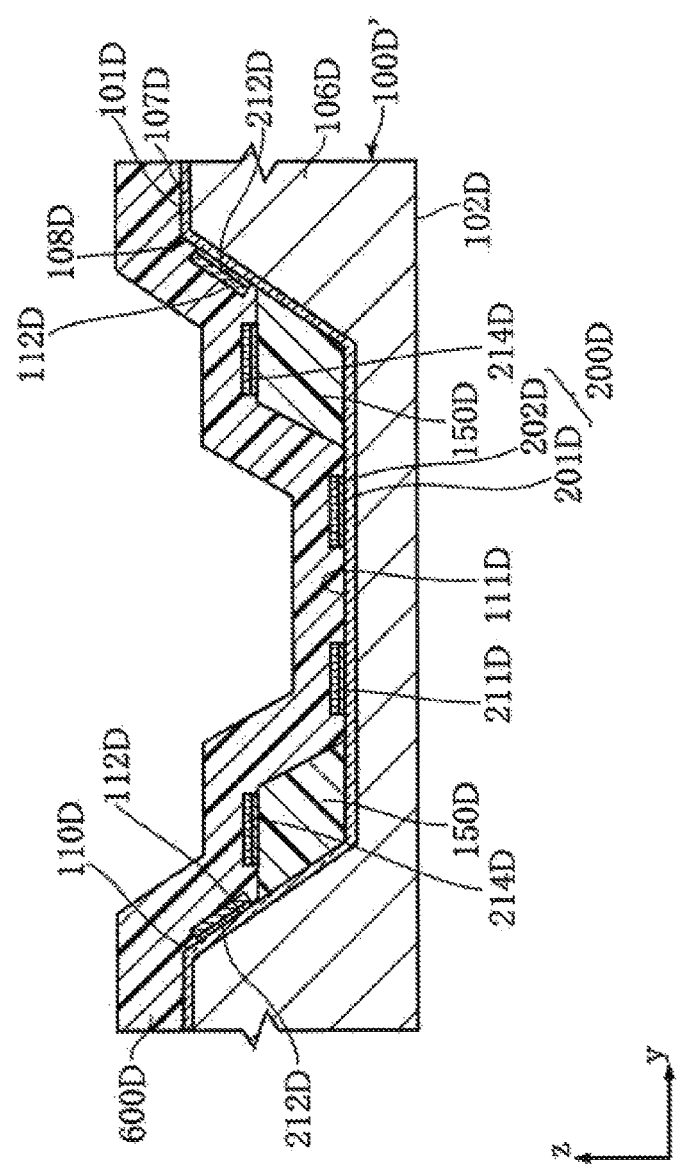
FIG. 33 is a cross-sectional view illustrating the order in which the columnar conductive portion is formed.

As illustrated in FIG. 32, the recess 108D is formed, and the resin forming portion 150D and the wiring layer 200D are formed on the substrate material 100D'. Thereafter, as illustrated in FIG. 33, a photoresist layer 600D is formed. The photoresist layer 600D is formed by spray coating of, such as, photosensitive epoxy resins.

Figure 34:
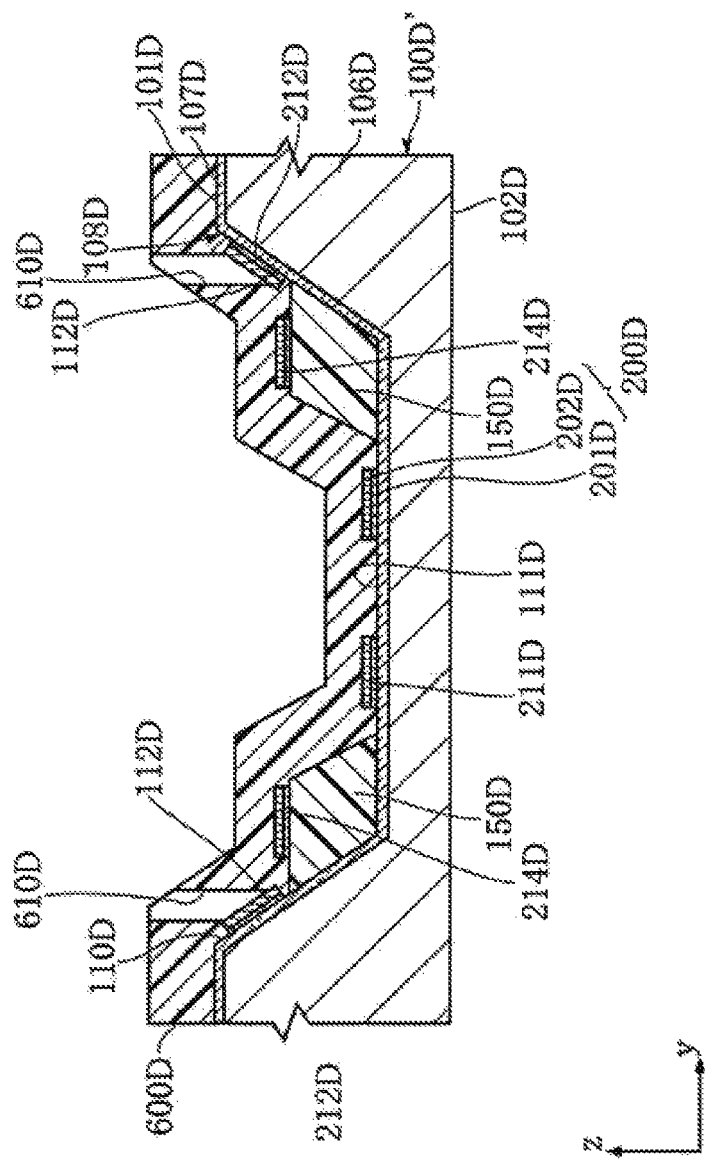
FIG. 34 is a cross-sectional view illustrating the order in which the columnar conductive portion is formed.

Subsequently, as illustrated in FIG. 34, the photoresist layer 600D is patterned. The patterning is achieved by, for example, performing the exposing and imaging procedures of photo lithography to the photoresist layer 600D, in this way, the desired portions are removed. The shape of the photoresist layer 600D obtained from this patterning process corresponds to the shapes of the columnar conductive portions 230D. Here, openings 610D corresponding to the shapes of the columnar conductive portions 230D are formed at the photoresist layer, and a portion of the first inclined inner lateral face pads 212D is exposed. Further, since the recess 108D has a certain level of depth, it is also feasible to change the focus depth of the exposure and performing multiple exposures at the same time.

Figure 35:
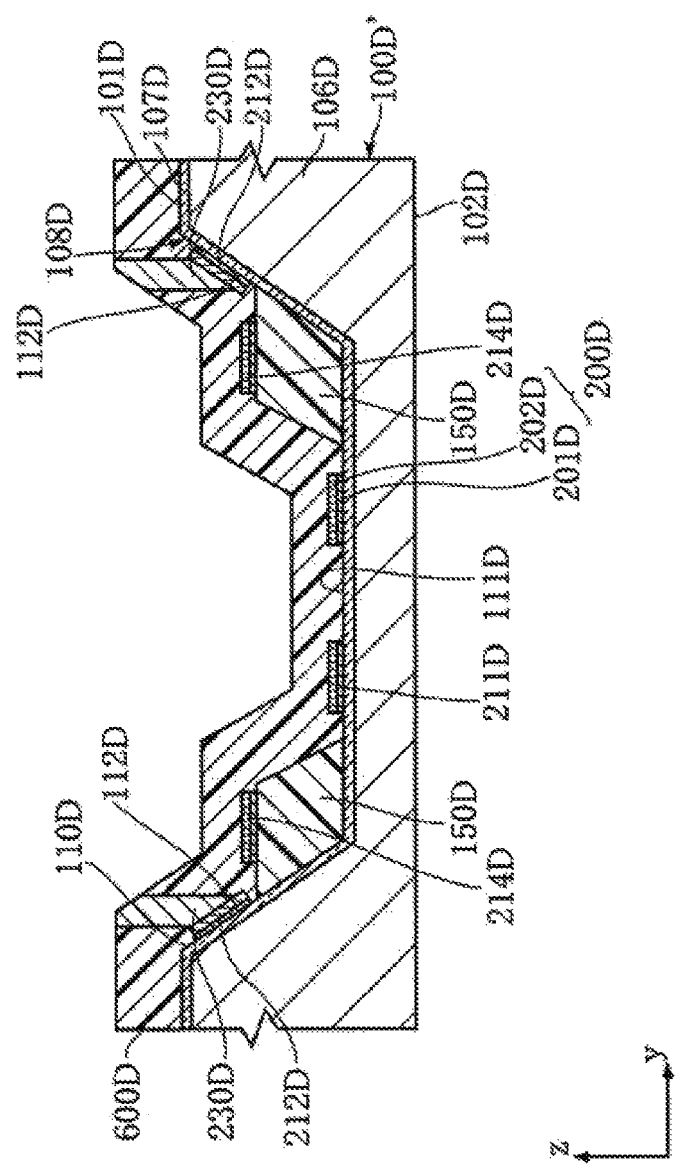
FIG. 35 is a cross-sectional view illustrating the order in which the columnar conductive portion is formed.

Thereafter, as illustrated in FIG. 35, the columnar conductive portions 230D are formed. The formation of the columnar conductive portions 230D is carried out by, for example, electroplating with the first inclined inner lateral face pads 212D. As a result, columnar conductive portions 230D comprising, such as, Cu are obtained.

Figure 36:
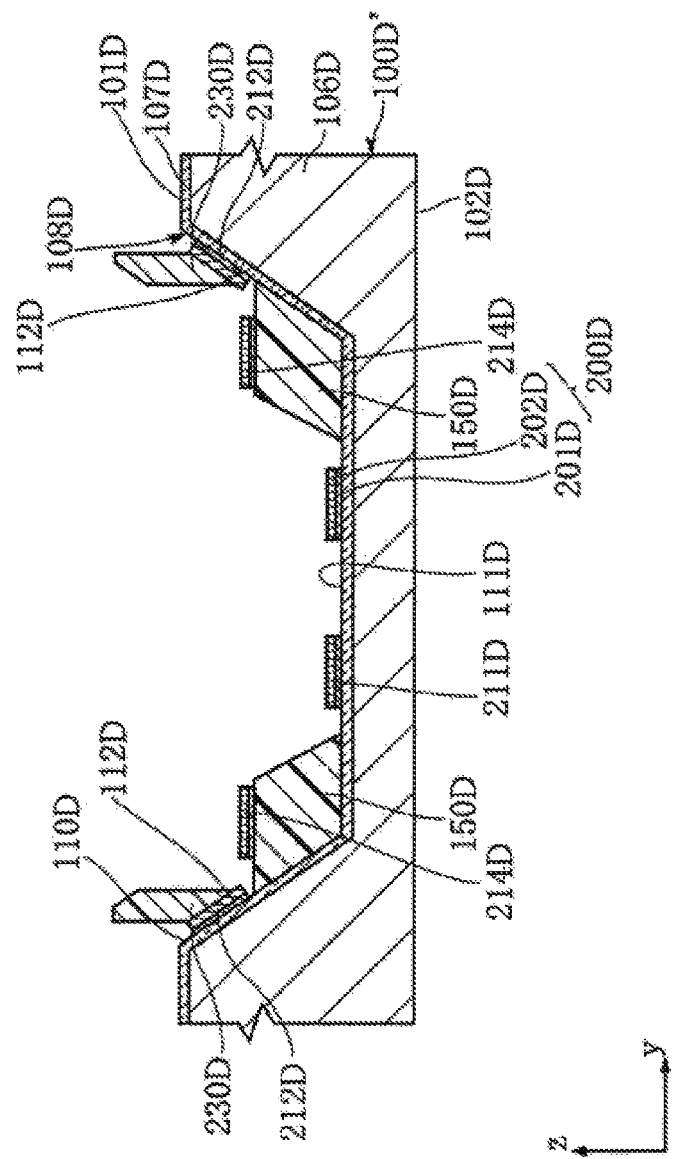
FIG. 36 is a cross-sectional view illustrating the order in which the columnar conductive portion is formed.
Figure 37:
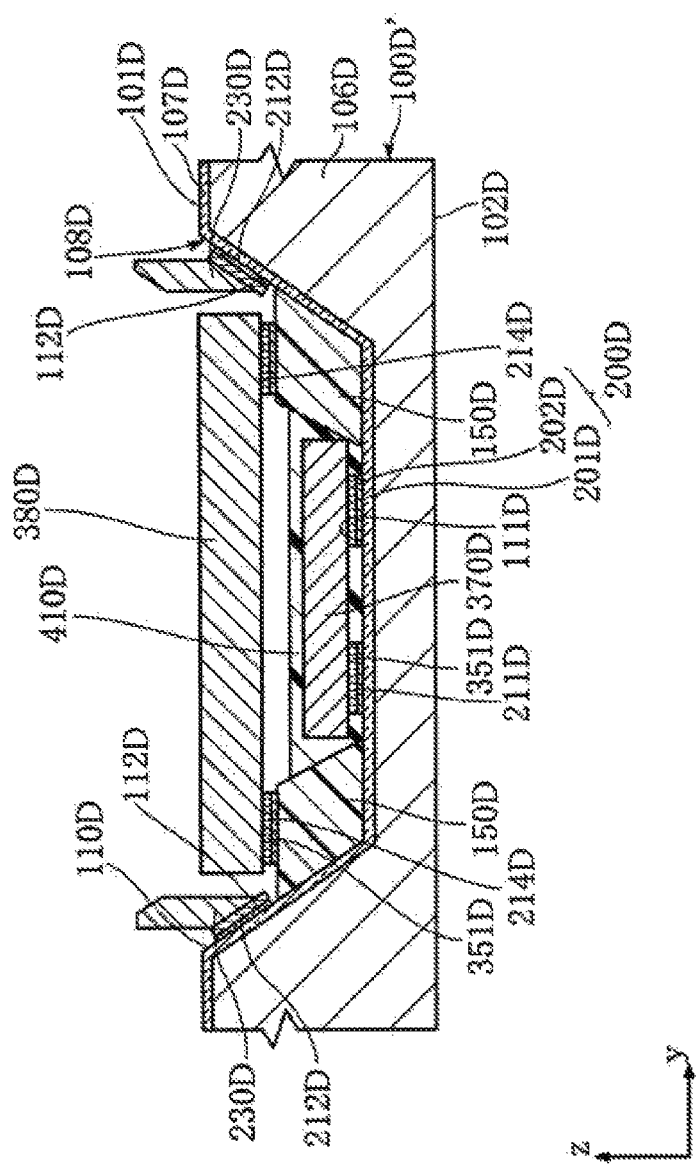
FIG. 37 is a cross-sectional view illustrating the order in which the columnar conductive portion is formed.

Then, as illustrated in FIG. 36, the photoresist layer 600D is removed, and the loading of the first element 370D, the formation of the first sealing resin 410D, and the loading of the second element 380D (referring to FIG. 37) are carried out sequentially.

Figure 38:
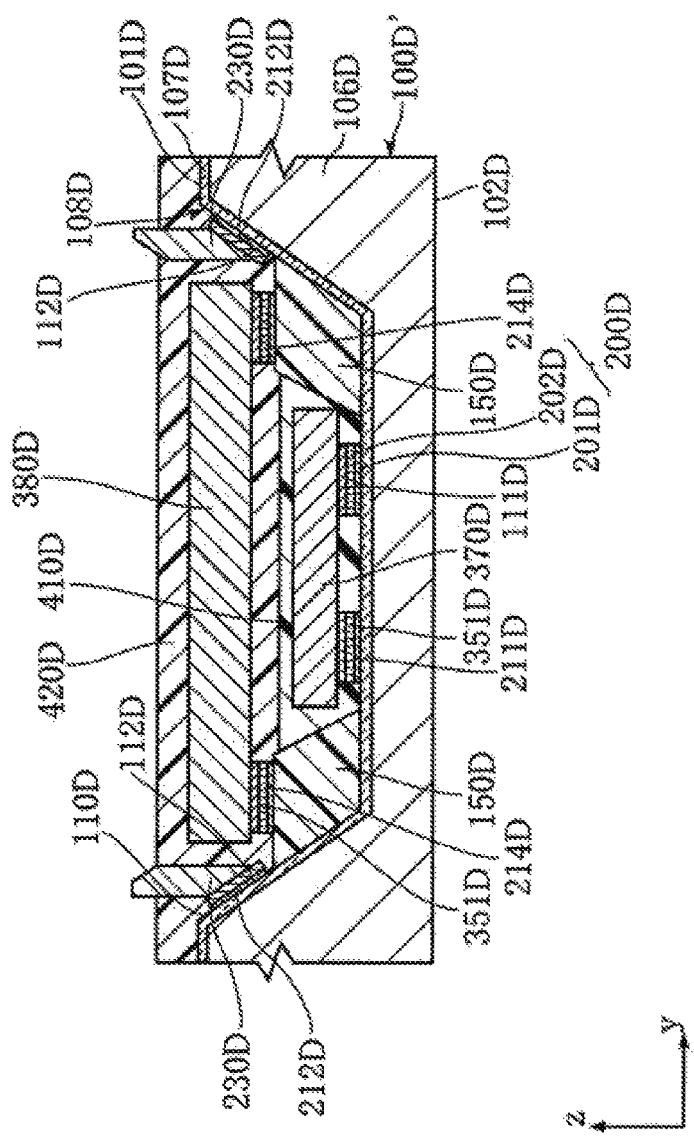
FIG. 38 is a cross-sectional view illustrating the order in which the columnar conductive portion is formed.
Figure 39:
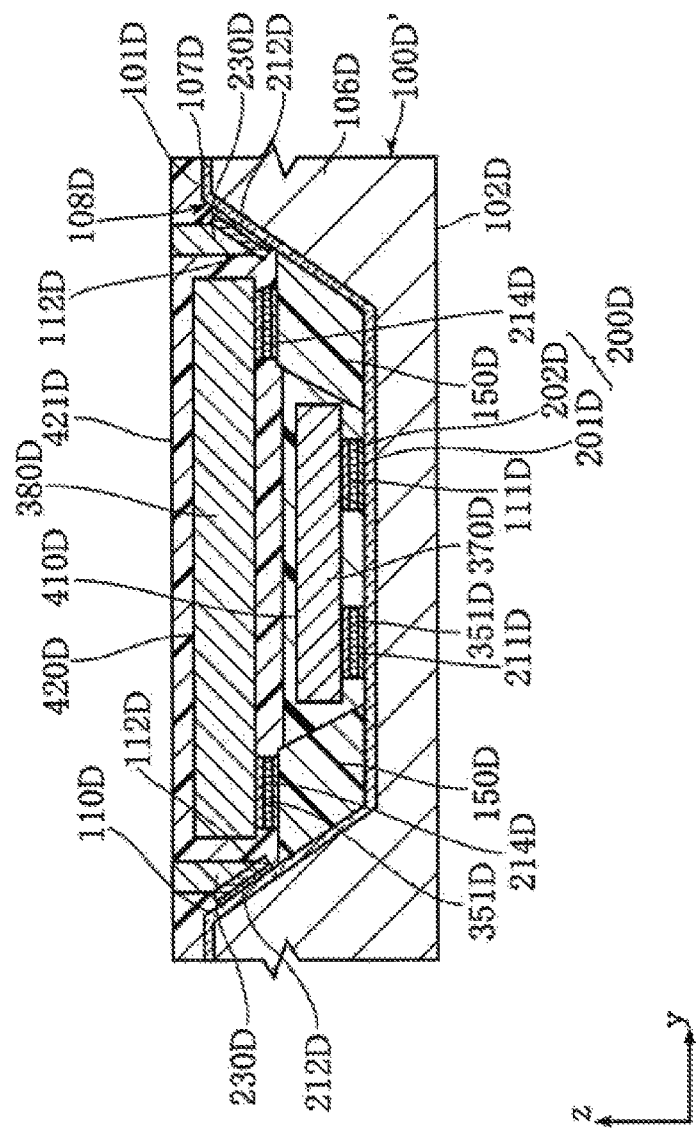
FIG. 39 is a cross-sectional view illustrating the order in which the columnar conductive portion is formed.

Afterwards, as illustrated in FIG. 38, the second sealing resin 420 is formed. At this time, the upper end of the columnar conductive portion 230D protrudes from the upper surface of the second sealing resin 420D. Thereafter, as illustrated in FIG. 39, the upper portion of the second sealing resin 420D is ground so that the upper end of the columnar conductive portion 230D in the drawing and the upper surface 421D of the second sealing resin 420D become co-planar.

Next, the function of the semiconductor device 1D is discussed.

According to the present embodiment, the first element 370D and the second element 380D are stacked and accommodated in the recess 108D (the first recess 110D) of the substrate 100D comprising a semiconductor material. Accordingly, there is no need to dispose wires for supporting the first element 370D and the second element 380D. As compared with the cases where the wires are formed by molding with dies, the cost associated with changing the shape of the substrate 100D that comprises the semiconductor material is less. Accordingly, the cost of the semiconductor device 1D is reduced. In particular, the effect of reduced cost is more significant when the semiconductor devices 1D are produced in lesser amount.

For the substrate 100D that consists of monocrystalline semiconductor material (such as, silicon), the first inclined inner lateral faces 112D can be processed to form surfaces that are accurately inclined in relative to the first bottom surface 111D and the second bottom surface 121A at a specific predetermined angle. In particular, by using the substrate 100D comprising Si and using the surface (100) as the main surface 101A, the respective inclined angle between the four first inclined inner lateral faces 112D in relative to the first bottom surface 111D is set as about 55°. In this way, it is feasible to obtain a semiconductor device 1D having a balanced shape.

The columnar conductive portion 230D is disposed to penetrate through the sealing resin 400D. The columnar conductive portion 230D extends from the recess 108D of the substrate 100D along the z direction, and is connected with the external terminals 250D. According to such configuration, when viewing from the z direction (the normal direction of the main surface 101D), the external terminals 250D are disposed at the inner side of the recess 108D. However, in the present embodiment, the dimension of the substrate 100D in the y direction can be reduced so that it is adapted to the miniaturization of the semiconductor device 1D.

The columnar conductive portion 230D extends from the first inclined inner lateral face 112D along the z direction. In this way, the interference among the first element 370D, the second element 370D and the columnar conductive portion 230Da could be avoided, while accomplishing the steric arrangement of said components in narrow space.

The lower end of the columnar conductive portion 230D is connected on the first inclined inner lateral face pads 212D. The columnar conductive portion 230D is formed on the first inclined inner lateral face pads 212D using electroplating, thereby being elevated from the inclined surface toward the z direction, and accurately connecting with the first inclined inner lateral face pads 212D.

The upper end of the columnar conductive portion 230D is co-planar with the upper surface 421D of the second sealing resin 420D, and is covered by the pads for the external terminals 240D. According to such configuration, it is feasible to connect the columnar conductive portion 230D and the external terminals 250D using the pads for the external terminals 240D accurately.

Figure 40:
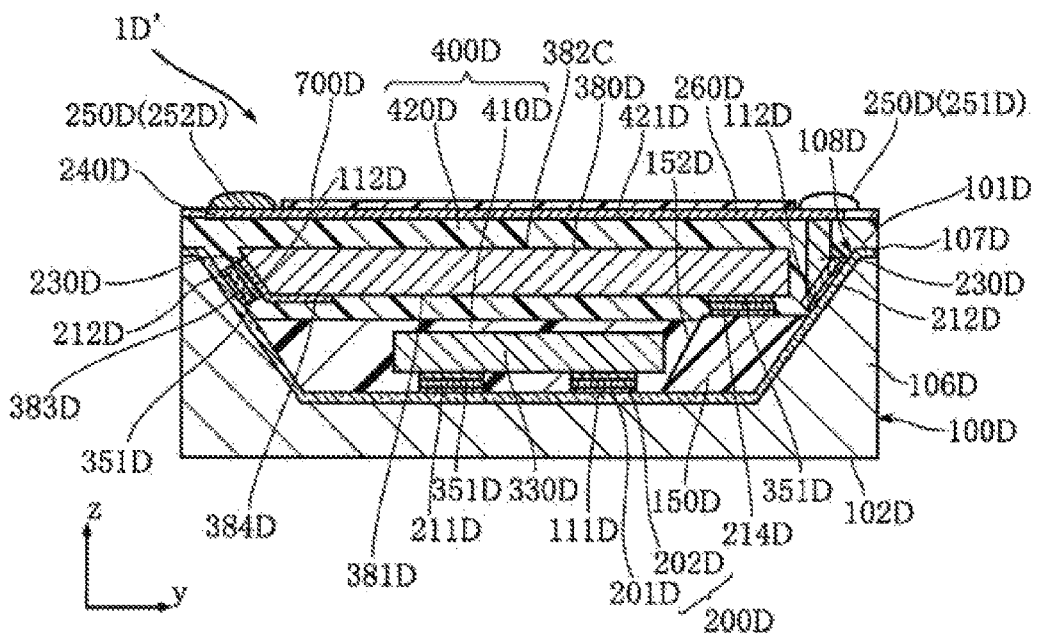
FIG. 40 is a cross-sectional view illustrating a variant different from that shown in FIG. 30 and FIG. 31 taken in the same view as that of FIG. 31.
Figure 41:
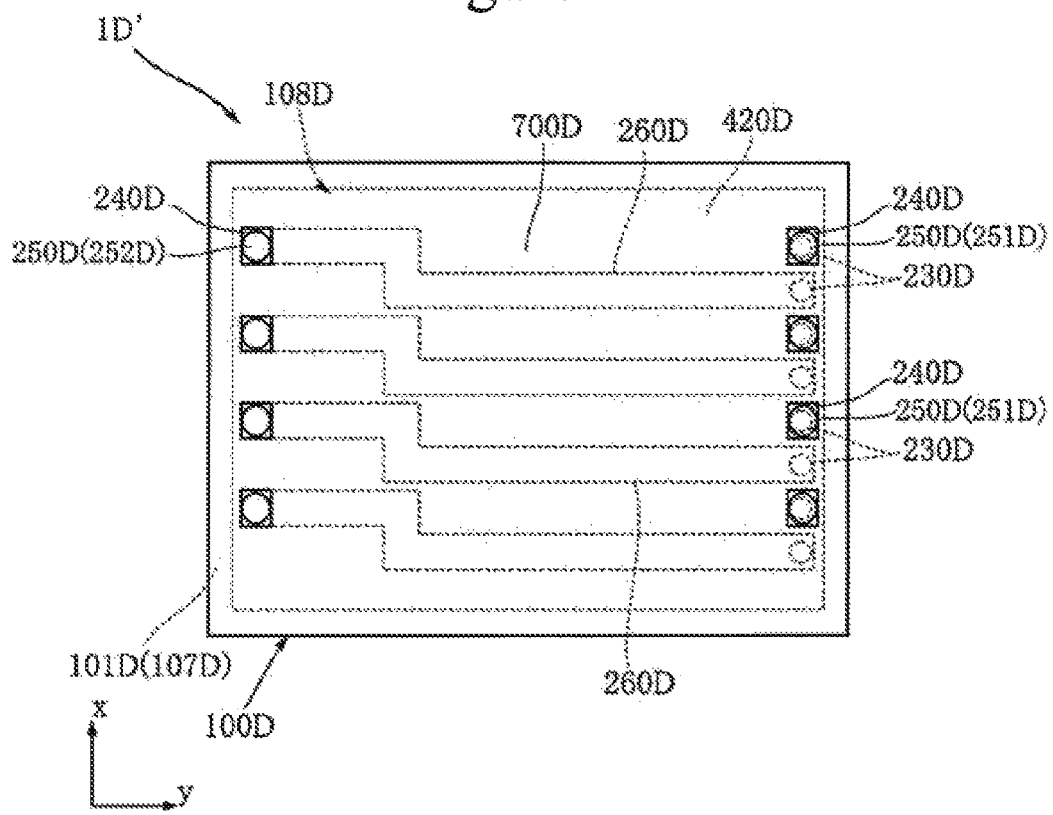
FIG. 41 is a schematic top view illustrating the semiconductor device in FIG. 40.

By forming the resin forming portion 150D at suitable portions within the recess 108D (the first recess 110D), the space configured to accommodate the first element 370D and the second element 380D can be formed in a two-step structure. By loading the integrated circuit element 370D on the first bottom surface 111D and loading the second element 380D on the resin forming portion 150D, it is feasible to sterically disposed the first element 370D and the second element 380D at different positions in the z direction. In this way, the miniaturization and high functionality of the semiconductor device 1D can be accomplished A variant example of the semiconductor device 1D is illustrated in FIG. 40 and FIG. 41. The semiconductor device 1D' of FIG. 40 and FIG. 41 comprises a substrate 100D, a resin forming portion 150D, a wiring layer 200D, columnar conductive portions 230D, a first element 370D, a second element 380D, and a sealing resin 400D. The semiconductor device 1D' of FIG. 40 and FIG. 41 differs from the semiconductor device 1D mainly in the configuration of the columnar conductive portions 230D and the supporting structure of the second element 380D.

In the semiconductor device 1D' of FIG. 40, the resin forming portion 150D is formed at the bottom surface (the first bottom surface 111D) of the recess 108D (the first recess 110D), and formed at a portion of the first bottom surface 111D that is closer to one end in the y direction (closer to the right end, as illustrated in the drawing). The resin forming portion 150D is configured to carry a portion of the second element 380D that is closer to one end in the y direction.

In the semiconductor device 1D' of FIG. 40 and FIG. 41, all of the plurality of columnar conductive portions 230D extend from the first inclined inner lateral face 112D located at the right side of the drawing toward the z direction. For the plurality of external terminals 250D, there are a plurality of external terminals 250D (251) located at the right side of the drawing and a plurality of external terminals 250D (252D) located at the left side of the drawing. The external terminals 251D, when viewing from the z direction (the normal direction of the main surface 101D), superimpose over the columnar conductive portions 230D. On the other hand, the external terminals 252D are located at positions that are separated from the external terminals 251D by the bottom surface 111D. The external terminals 252D and columnar conductive portions 230 are formed on the second sealing resin 420D, and are conducted by the wiring pattern 260D. Also, the wiring pattern 260D and the second sealing resin 420D are covered by the photoresist 700D that comprises an insulating material. The photoresist allows the external terminals 251D and 252D to be exposed, and, when viewing from the z direction, covers the whole surface other than the external terminals 251D and 252D.

The left end of the second element 380D in the drawing is supported by the first inclined inner lateral face 112D, and loaded using the solder 351D for separating the plurality of first inclined inner lateral face pads 212D. The second element 380D comprises an opposite main surface 381D, and opening-side main surface 382D and an inclined lateral surface 383D. The opposite main surface 381D faces the first element 370D. The opening-side main surface 382D is located the opposite side of the opposite main surface 381D in the z direction. Also, the area of the opening-side main surface 382D is configured to be greater than the area of the opposite main surface 381D. The inclined lateral surface 383D is one of the four lateral surfaces that connects the opposite main surface 381D and the opening-side main surface 382D and is the lateral surface that faces one side in the y direction (the left side in the drawing). The inclined lateral surface 383D inclines in relative to the opposite main surface 381D, and in the present embodiment, the inclined angle between the inclined lateral surface 383D and the opposite main surface 381D is about 55°.

In the second element 380D, at the specific area that transverse from the inclined lateral surface 383D across the opposite main surface 381D, a wiring pattern 381D comprising a conductive metal thin film is formed. By using such configuration, when the second element 380D is loaded, the first inclined inner lateral face 112D and the inclined lateral surface 383D of the second element 380D face each other in substantially parallel alignment.

In the semiconductor device 1D' of FIG. 40 and FIG. 41, all of the columnar conductive portions 230D are collectively formed in one area of the first inclined inner lateral face 112D (that is, the first inclined inner lateral face 112D at the right side of the drawing). Also, the second element 380D supported at the first inclined inner lateral face 112D with the inclined lateral surface 383D located at the left side of the drawing. Therefore, it is feasible to avoid the interference between the plurality of columnar conductive portions 230D and the second element 380D. Hence, it is possible to increase the size of the second element 380D on the one hand, while miniaturizing the overall dimension of the semiconductor device 1D' on the other hand. Also, the external terminals 251D and the external terminals 252D are separately disposed in the y direction. In this way, it is feasible to install the semiconductor device 1D' on the substrate of an electronic apparatus with good balance.

Figure 42:
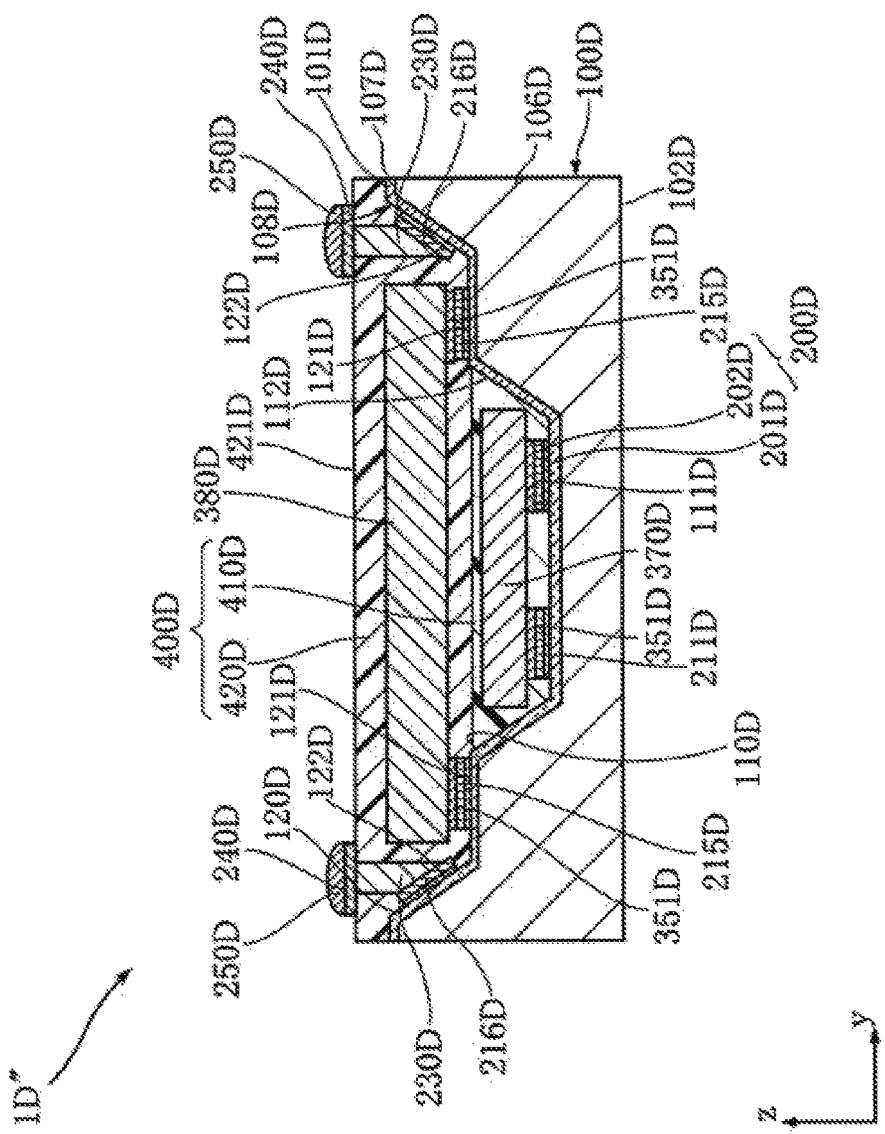
FIG. 42 is a cross-sectional view illustrating a variant different from that shown in FIG. 30 and FIG. 31 taken in the same view as that of FIG. 31.

Another variant example of the semiconductor device 1D is provided in FIG. 42. The semiconductor device 1D" of FIG. 42 comprises a substrate 100D, a wiring layer 200D, columnar conductive portions 230D, a first element 370D, a second element 380D, and a sealing resin 400D. The semiconductor device 1D" of FIG. 42 differs from the semiconductor device 1D mainly in the shape of the recess 108D of the substrate 100D and the lack of the resin forming portion 150D.

In the semiconductor device 1D" of FIG. 42, the recess 108D comprises a first recess 110D and a second recess 120D. The first recess 110D is located at the side of the back surface 102D, and comprises a first bottom surface 111D and four first inclined inner lateral faces 112D. The second recess 120D is closer to side of the main surface 101D than the first recess 110D is, and comprises two second bottom surfaces 121D and four second inclined inner lateral faces 122D. The shapes of the first recess 110D and the second recess 120D are dependent on the surface (100) that is used as the main surface 101D. The configurations of the first recess 110D and the second recess 120D is similar to the configurations of the first recess 110A and the second recess 120A of FIG. 5.

The second recess 120D has a rectangular shape in the plan view. Each of the two second bottom surfaces 121D has a rectangular shape in the plan view, and is separated by the first recess 110D. Also, each second bottom surface 121D is connected with the first inclined inner lateral face 112D. The four second inclined inner lateral faces 122D, as viewed from the plan view, surround the two second bottom surfaces 121D, and are substantially trapezoid in shape. Each second inclined inner lateral face 122D is inclined in relative to the second bottom surface 121D. In the present embodiment, an inclined angle of the second inclined inner lateral face 122D and the xy plane is about 55°. Further, the second inclined inner lateral face 122D is substantially in a trapezoid shape and the inclined angle of about 55° is dependent on the surface (100) that is used as the main surface 101D.

In the semiconductor device 1D" of FIG. 42, the wiring layer 200D comprises a first bottom surface pad 211D, second bottom surface pads 215D, second inclined inner lateral face pads 216D and connection paths (not shown in the drawing) for interconnecting said elements.

Each second bottom surface pads 215D is formed on the second bottom surface 121D. In the present embodiment, a plurality of second bottom surface pads 215D are formed on each of the two second bottom surfaces 121D separated by the first bottom surface 111D in the y direction. The second bottom surface pad 215D is configured to carry the second element 380D.

Each second inclined inner lateral face pads 216D is formed on the second inclined inner lateral face 122D of the second recess 120D. In the present embodiment, a plurality of second inclined inner lateral face pads 216D are formed on each of the two second inclined inner lateral faces 122D separated by the first bottom surface 111D in the y direction. The second inclined inner lateral face pads 216D are connected with a portion of one end of the columnar conductive portion 230D.

In the semiconductor device 1D" of FIG. 42, the recess 108D is formed into a two-step shape using the first recess 110D and the second recess 120D, so that the first recess 110D is configured to specifically accommodate the first element 370D. In this way, it is feasible to accurately and sterically dispose the first element 370D and the second element 380D.

The semiconductor devices of the present invention are not limited to the embodiments of the present disclosure. Rather, the carious alternation can be made to the specific configuration of each portion of the semiconductor device according to the present invention.

In conclusion, variations and modifications to the claimed invention are summarized in the notes as follows.

A semiconductor device comprises: a substrate, including a main surface and a recess depressed from the main surface, and comprising a semiconductor material; a wiring layer, at least a portion of the wiring layer is formed on the substrate; one or more elements, accommodated in the recess; a sealing resin, covering at least a portion of the one or more elements; and a resin forming portion, formed on at least one of the main surface and the recess.

The resin forming portion includes a first resin forming portion formed on the main surface, and the wiring layer comprises a plurality of external terminals formed on the first resin forming portion.

The semiconductor device further comprises an additional element for covering at least a portion of the one or more elements.

The recess comprises an inclined inner lateral face that is inclined in relative to the main surface inclined and a bottom surface.

The resin forming portion comprises a second resin forming portion formed on the bottom surface, and the additional element is carried by the second resin forming portion.

The wiring layer comprises a plurality of second resin forming portion pads that are formed on the second resin forming portion, and configured to carry the additional element.

The substrate comprises mono crystalline semiconductor material.

The semiconductor material is silicon.

The main surface is surface (100), and the recess comprises four inclined inner lateral faces.

The recess comprises a first recess for accommodating the one or more elements, and a second recess that is closer to the main surface than the first recess is, and the bottom surface comprises a first bottom surface for forming the first recess, and a second bottom surface for forming the second recess, wherein the second bottom surface is closer to the main surface than the first bottom surface is, the inclined inner lateral face comprises a first inclined inner lateral face for forming the first recess, and a second inclined inner lateral face for forming the second recess and connected with the second bottom surface and the main surface, the second resin forming portion is formed on the second bottom surface.

The substrate comprises outer lateral faces that intersect with each other in relative to the main surface, and each of the outer lateral faces comprises an inclined outer lateral face that is interposed between the vertical outer lateral face and the main surface or the vertical outer lateral face, and is inclined in relative to any one of the main surface and the vertical outer lateral face.

The inclined outer lateral face is smoother than the vertical outer lateral face.

When viewing from the normal direction of the main surface, the outer lateral face surrounds the main surface and has a shape of rectangular ring.

The semiconductor device further comprises an additional element for covering at least a portion of the one or more elements; and the recess comprises a first recess for accommodating the one or more elements and comprising a first bottom surface and a first inclined inner lateral face, and a second recess comprising a second bottom surface connected with the first inclined inner lateral face and a second inclined inner lateral face connected with the second bottom surface and the main surface.

The resin forming portion comprises a second resin forming portion formed on the second bottom surface, and the additional element is carried by the second resin forming portion.

The wiring layer comprises a plurality of second resin forming portion pads that are formed on the second resin forming portion and configured to carry the additional element.

The substrate comprises a monocrystalline semiconductor material.

The semiconductor material is silicon.

The main surface is surface (100), and the first recess comprises four said first inclined inner lateral faces, the second recess comprising four said second inclined inner lateral faces.

An inclined angle between the inclined outer lateral face and the main surface is the same as the inclined angle between the first inclined inner lateral face and main surface and between the second inclined inner lateral face and the main surface.

What is claimed is:

1. A semiconductor device, comprising:
   a substrate, including a main surface and a recess depressed from the main surface, and comprising a semiconductor material;
   a wiring layer, at least a portion of the wiring layer formed on the substrate;
   one or more elements, accommodated in the recess;
   a sealing resin, configured to cover at least a portion of the one or more elements; and a resin forming portion, formed on at least one of the main surface and the recess;

wherein the substrate comprises outer lateral faces that intersect with each other relative to the main surface, and each of the outer lateral faces comprises a vertical outer lateral face, and an inclined outer lateral face interposed between the main surface and the vertical outer lateral face and inclined relative to any one of the main surface and the vertical outer lateral face.

2. The semiconductor device according to claim 1, wherein the resin forming portion includes a first resin forming portion formed on the main surface, and the wiring layer comprises a plurality of external terminals formed on the first resin forming portion.

3. The semiconductor device according to claim 1, further comprising an additional element for covering at least a portion of the one or more elements.

4. The semiconductor device according to claim 3, wherein the recess includes an inclined inner lateral face inclined relative to the main surface, and a bottom surface.

5. The semiconductor device according to claim 4, wherein the resin forming portion comprises a second resin forming portion formed on the bottom surface, and the additional element is carried by the second resin forming portion.

6. The semiconductor device according to claim 5, wherein the wiring layer comprises a plurality of second resin forming portion pads formed on the second resin forming portion, and configured to carry the additional element.

7. The semiconductor device according to claim 6, wherein the substrate comprises a monocrystalline semiconductor material.

8. The semiconductor device according to claim 7, wherein the semiconductor material is silicon.

9. The semiconductor device according to claim 8, wherein the main surface is surface (100), and the recess comprises four of the inclined inner lateral faces.

10. The semiconductor device according to claim 5, wherein the recess comprises a first recess for accommodating the one or more elements, and a second recess that is closer to the main surface than the first recess, and the bottom surface comprises a first bottom surface for forming the first recess, and a second bottom surface for forming the second recess, wherein the second bottom surface is closer to the main surface than the first bottom surface, the inclined inner lateral face comprises a first inclined inner lateral face for forming the first recess, and a second inclined inner lateral face for forming the second recess and connected with the second bottom surface and the main surface, the second resin forming portion is formed on the second bottom surface.

11. The semiconductor device according to claim 1, wherein the inclined outer lateral face is smoother than the vertical outer lateral face.

12. The semiconductor device according to claim 11, wherein, when viewing from a normal direction of the main surface, the outer lateral face surrounds the main surface and has a shape of a rectangular ring.

13. The semiconductor device according to claim 1, further comprising an additional element for covering at least a portion of the one or more elements;

wherein the recess comprises a first recess for accommodating the one or more elements and comprising a first bottom surface and a first inclined inner lateral face, and a second recess comprising a second bottom surface connected with the first inclined inner lateral face and a second inclined inner lateral face connected with the second bottom surface and the main surface.

14. The semiconductor device according to claim 13, wherein the resin forming portion comprises a second resin forming portion formed on the second bottom surface, and the additional element is carried by the second resin forming portion.

15. The semiconductor device according to claim 14, wherein the wiring layer comprises a plurality of second resin forming portion pads formed on the second resin forming portion and configured to carry the additional element.

16. The semiconductor device according to claim 13, wherein the substrate comprises a monocrystalline semiconductor material.

17. The semiconductor device according to claim 16, wherein the semiconductor material is silicon.

18. The semiconductor device according to claim 17, wherein the main surface is surface (100), the first recess comprises four of the first inclined inner lateral faces, and the second recess comprises four of the second inclined inner lateral faces.

19. The semiconductor device according to claim 13, wherein an inclined angle between the inclined outer lateral face and the main surface is the same as an inclined angle between the first inclined inner lateral face and the main surface and an inclined angle between the second inclined inner lateral face and the main surface.

* * * * *